(12) United States Patent
Tang et al.

(10) Patent No.: US 11,450,336 B1
(45) Date of Patent: Sep. 20, 2022

(54) SYSTEM AND METHOD FOR SMART FEEDBACK CANCELLATION

(71) Applicant: Dialpad, Inc., San Ramon, CA (US)

(72) Inventors: Qian-Yu Tang, Milpitas, CA (US); Corey Burke, Oakland, CA (US)

(73) Assignee: DIALPAD, INC., San Ramon, CA (US)

( * ) Notice: Subject to any disclaimer, the term of this patent is extended or adjusted under 35 U.S.C. 154(b) by 17 days.

(21) Appl. No.: 17/104,625

(22) Filed: Nov. 25, 2020

(51) Int. Cl.
  G10L 21/0264  (2013.01)
  G10L 19/022   (2013.01)
  G10L 15/02    (2006.01)
  G10L 15/08    (2006.01)
  G10L 21/0208  (2013.01)

(52) U.S. Cl.
  CPC .......... G10L 21/0264 (2013.01); G10L 15/02 (2013.01); G10L 15/083 (2013.01); G10L 19/022 (2013.01); G10L 2021/02082 (2013.01)

(58) Field of Classification Search
  CPC ... G10L 21/02; G10L 21/038; G10L 21/0232; G10L 2021/02082
  See application file for complete search history.

(56) References Cited

U.S. PATENT DOCUMENTS

| | | | | |
|---|---|---|---|---|
| 8,442,251 B2* | 5/2013 | Jensen | ................. | H04R 25/453 381/94.1 |
| 8,462,193 B1* | 6/2013 | Truong | ................. | H04M 9/082 379/406.01 |
| 10,117,021 B1* | 10/2018 | Truong | ................. | H03G 5/025 |
| 10,530,936 B1* | 1/2020 | Khanagha | ............. | H04M 9/085 |
| 2005/0047620 A1* | 3/2005 | Fretz | ................... | H04R 25/453 381/317 |
| 2012/0128167 A1* | 5/2012 | Tanaka | ..................... | H04R 3/02 381/94.1 |
| 2015/0372723 A1* | 12/2015 | Gao | .................... | G10L 21/0232 704/205 |
| 2016/0029124 A1* | 1/2016 | Paranjpe | ............. | G10L 21/0232 381/71.14 |
| 2017/0019734 A1* | 1/2017 | Zurek | ..................... | G10L 25/78 |
| 2017/0103774 A1* | 4/2017 | Sørensen | ............ | G10L 21/0232 |
| 2018/0063654 A1* | 3/2018 | Kuriger | ................ | H04R 25/453 |

(Continued)

OTHER PUBLICATIONS

Series P: Telephone Transmission Quality, Telephone Installations, Local Line Networks, Telecommunication Standardization Sector of ITU, p. 862, Feb. 2001, 30 pgs.

(Continued)

*Primary Examiner* — Shaun Roberts
(74) *Attorney, Agent, or Firm* — Patent Law Works LLP

(57) ABSTRACT

A system and method are described for automatic acoustic feedback cancellation in real time. In some implementations, the system may receive audio data describing an audio signal, which the system may use to determine a set of frames of the audio signal. Spectral analysis may be performed on the one or more frames of the audio to detect spectral patterns of two or more frames indicative of acoustic feedback. An additional delay identification test may be performed to identify a consistent delay indicative of acoustic feedback. In some implementations, a state machine is advanced based in part on accumulated delay votes. Decisions can be made to mute the acoustic feedback and cease the muting operation when silence is detected.

26 Claims, 15 Drawing Sheets

(56) References Cited

U.S. PATENT DOCUMENTS

2018/0350378 A1* 12/2018 Bullough ................. H04R 3/02
2019/0356984 A1* 11/2019 Anemüller ............... H04R 3/04

OTHER PUBLICATIONS

Series G: Transmission Systems and Media, Digital Systems and Networks, International telephone connections and circuits—General definitions, Telecommunication Standardization Sector of ITU, G. 107, Mar. 2005, 28 pgs.

Van Waterschoot et al., "Fifty Years of Acoustic Feedback Control: State of the Art and Future Challenges", Proceedings of the IEEE, vol. 99, No. 2, Feb. 2011, 40 pgs.

* cited by examiner

| Index $i$ | $CB_L(i)$ | $CB_H(i)$ |
|---|---|---|
| 0 | 0 | 3 |
| 1 | 4 | 6 |
| 2 | 7 | 10 |
| 3 | 11 | 13 |
| 4 | 14 | 16 |
| 5 | 17 | 20 |
| 6 | 21 | 25 |
| 7 | 26 | 29 |
| 8 | 30 | 35 |
| 9 | 36 | 41 |
| 10 | 42 | 47 |
| 11 | 48 | 55 |
| 12 | 56 | 64 |
| 13 | 65 | 74 |
| 14 | 75 | 86 |
| 15 | 87 | 100 |
| 16 | 101 | 118 |
| 17 | 119 | 128 |

Figure 6

| Index $i$ | $CB_L(i)$ | $CB_H(i)$ |
|---|---|---|
| 0 | 0 | 1 |
| 1 | 2 | 3 |
| 2 | 4 | 5 |
| 3 | 6 | 8 |
| 4 | 9 | 10 |
| 5 | 11 | 12 |
| 6 | 13 | 15 |
| 7 | 16 | 19 |
| 8 | 20 | 22 |
| 9 | 23 | 26 |
| 10 | 27 | 31 |
| 11 | 32 | 36 |
| 12 | 37 | 42 |
| 13 | 43 | 48 |
| 14 | 49 | 57 |
| 15 | 58 | 66 |
| 16 | 67 | 78 |
| 17 | 79 | 93 |
| 18 | 94 | 112 |
| 19 | 113 | 136 |
| 20 | 137 | 163 |
| 21 | 164 | 202 |
| 22 | 203 | 255 |
| 23 | 256 | 330 |
| 24 | 331 | 512 |

Figure 7

SYSTEM AND METHOD FOR SMART FEEDBACK CANCELLATION

TECHNICAL FIELD

This disclosure pertains generally to computerized telephony, audio enhancement technology, and communication systems, and in particular, to a system and method for smart feedback cancellation in telephony applications.

BACKGROUND

Audio enhancement may be performed in telephony applications to improve voice quality. However, one unresolved problem in the prior art lies in acoustic feedback control. For example, in a teleconferencing application, there may be a closed loop path in which there is acoustic feedback, such as may happen when different instances of a teleconference application are used. For example, sound emitted from one user's speakers may be picked up by another user's microphone. An initial sound burst may experience acoustic feedback and be amplified over time into an annoying howling sound.

While the problem of acoustic feedback occurs in teleconferencing, the problem of acoustic feedback is quite old in terms of acoustic feedback experienced in phone conferencing and public address (PA) systems. Surprisingly, there have been no reliable automatic solutions to this problem of acoustic feedback in the prior art. The article "Fifty years of Acoustic Feedback Control: State of the Art and Future Challenges," by T. V. Waterschoot and M. Moonen, Proceedings of the IEEE, Vol. 99, no. 2, pp. 288-327, February 2011 describes the challenges of acoustic feedback. Acoustic feedback has been used to refer to undesired acoustic coupling as well as the howling effect that results from that coupling. As observed in the paper, "Surprisingly enough, despite 50 years of research on automatic acoustic feedback control, many PA system technicians still prefer to prosecute manual control of acoustic feedback. The main reason for this is lack of reliability in the available automatic acoustic feedback control solutions, i.e., howling may still occur and even take more time to be eliminated than in the case of manual control."

Despite tremendous research efforts in the field of acoustic feedback control, there haven't been reliable solutions for automatic feedback control for telephony applications due to the technical difficulties. Thus in many teleconferencing applications there can be highly undesirable howling sounds when a closed-loop path generates acoustic feedback.

It would be desirable to address these issues.

SUMMARY

A method and system for automatically performing acoustic feedback cancellation in real time is disclosed. In the spectral domain, spectral attributes of frames associated with a howling effect are detected and matches identified. This may include detecting matches for two or more frames based on a spectrum match based on a normalized distance of signal spectral energies or a tone event match. The normalized distance of signal spectral energized may include a measure of distance substantially immune to magnitude difference and focus on frequency components relevant to acoustic feedback.

A delay identification test may be performed to check for convergence to a consistent delay value of detected matches indicative of the howling effect. In one embodiment, votes are added to a delay buffer based on detecting a spectrum match or a tone event match. The accumulated delay votes may be analyzed to perform a delay identification test.

A state machine implementation may use a state machine in which the accumulated delay votes are used to determine how states of the state machine are advanced between an initial state and a cancellation state in which the acoustic feedback is cancelled. A variety of optimizations are described for optimizing various tradeoffs associated with rapidly and reliably make decision to cancel acoustic feedback in telephony applications.

The features and advantages described in this summary and in the following detailed description are not all-inclusive and, particularly, many additional features and advantages will be apparent to one of ordinary skill in the relevant art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 6 and FIG. 7 illustrate examples of critical band bin distributions.

The Figures depict various example implementations for purposes of illustration only. One skilled in the art will readily recognize from the following discussion that alternative examples of the structures and methods illustrated herein may be employed without departing from the principles described herein.

DETAILED DESCRIPTION

The technology described herein monitors the content and/or sound characteristics of audio signals, automatically detects acoustic feedback, and, in some instances, may mute or cancel the acoustic feedback sound. For instance, the disclosure describes a system and method for intelligently performing a spectral analysis per frame for an incoming audio signal, identifying acoustic feedback events, determining conditions for muting or canceling an acoustic feedback sound, and may further identify when to release the muting.

With reference to the figures, reference numbers may be used to refer to components found in any of the figures, regardless whether those reference numbers are shown in the figure being described. Further, where a reference number includes a letter referring to one of multiple similar components (e.g., component 000a, 000b, and 000n), the reference number may be used without the letter to refer to one or all of the similar components.

I. System Overview

Figure 1:
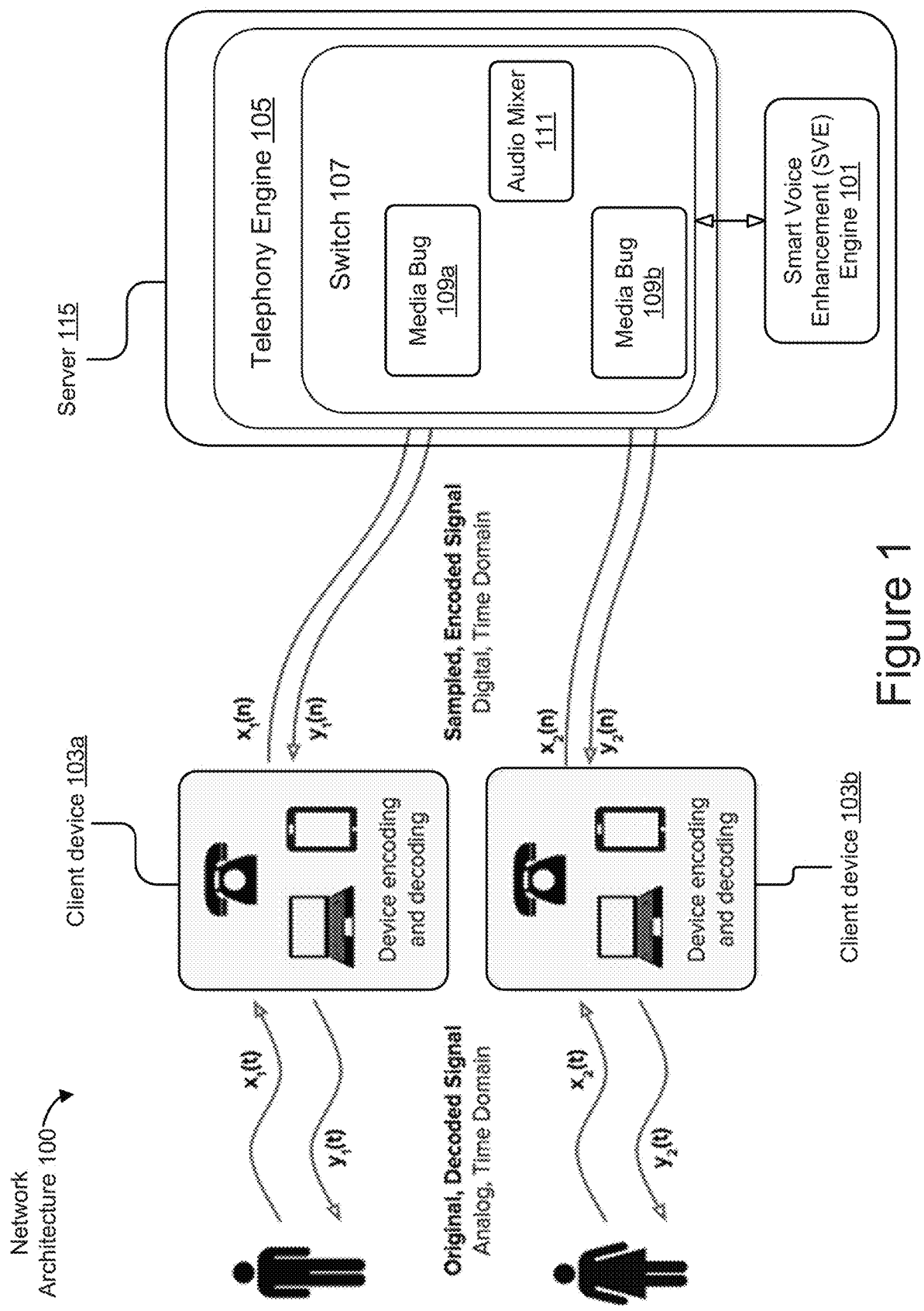
FIG. 1 is a block diagram of an exemplary network architecture in which audio signals may be analyzed.

FIG. 1 is a block diagram of an exemplary network architecture 100 in which audio signals may be analyzed. The network architecture 100 may represent a telephony engine data path in which a smart voice enhancement engine 101 may be implemented. The illustrated network architecture may include one or more servers 115 and one or more endpoint client devices 103, which may be communicatively coupled via a network (not illustrated). In some implementations, the client devices 103a and 103b may be coupled via a network and may communicate via and/or receive services provided by the telephony engine 105 and/or a smart voice enhancement engine 101. It is to be understood that, in practice, orders of magnitude more endpoints (e.g., 103) and servers (e.g., 115) can be deployed.

A smart voice enhancement engine 101 is illustrated as residing on a server 115. It is to be understood that, in different implementations, the smart voice enhancement engine 101 can reside on different servers 115, client devices 103, or be distributed between multiple computing systems in different ways, without departing from the scope of this disclosure.

Smart voice enhancement on a server side in a communication system improves voice quality by removing impairments such as noise and echo in telephony applications. In typical voice-over-internet (VOIP) applications, audio packets arrive at the server one by one, at certain pace (e.g., every 20 milliseconds) following the packet time, called p-time, which audio data may be in a time domain.

Noise cancellation on the server side, such as using a smart voice enhancement engine 101 coupled or integrated with the telephony engine 105, may remove ambient noise from noisy speech thereby improving voice quality and intelligibility of noise-contaminated speech. Cancellation performed on client devices 103 (e.g., smartphones, personal computers, etc.) may use multiple microphones to aid noise cancellation, but information from multiple microphones may not be available at a server 115, so the smart voice enhancement engine 101 may apply noise cancellation/reduction to a noise-contaminated audio signal.

Many different networking technologies can be used to provide connectivity from endpoint computer systems 103 to servers 115. Some examples include: LAN, WAN, and various wireless technologies. Endpoint systems 103 are able to access applications and/or data on server 115 using, for example, a web browser or other endpoint software (not shown). Endpoint client devices 103 can be in the form of, for example, desktop computers, laptop computers, smartphones, analog phones, or other communication devices capable of sending and/or receiving audio. Servers 115 can be in the form of, for example, rack mounted or tower computers or virtual servers implemented as software on a computing device, depending on the implementation.

Although FIG. 1 illustrates two endpoints 103 and one server 115 as an example, in practice many more (or fewer) devices can be deployed as noted above. In some implementations, the network is in the form of the internet, a public switched telephone network (PSTN), and/or a different communication system. Other networks or network-based environments can be used in addition to or instead of the internet in other implementations.

As illustrated in FIG. 1, a user may communicate with a client device 103a using speech or other audio, which may be received by the client device 103a as analog time-domain audio. In some implementations, the client device 103a may transmit the audio to the server 115 in a digital time-domain audio signal, although other implementations are possible. For instance, the telephony engine 105 may receive the audio signal from the client device 103a and, using a switch 107 may relay the audio to a second client device 103b, which may convert the audio signal to audio using an output device. It should be noted that the telephony engine 105 may enable two way communication between the client devices 103.

The telephony engine 105 may include a switch 107 and, in some implementations, a smart voice enhancement engine 101. In some implementations, the switch 107 may include an application server that enables real-time communication of audio and/or video using telecommunications and/or VoIP, for example. The switch 107 may run one or more media bugs 109a and 109b, an audio mixer 111, and, in some instances, a smart voice enhancement engine 101 or components thereof.

Figure 3:
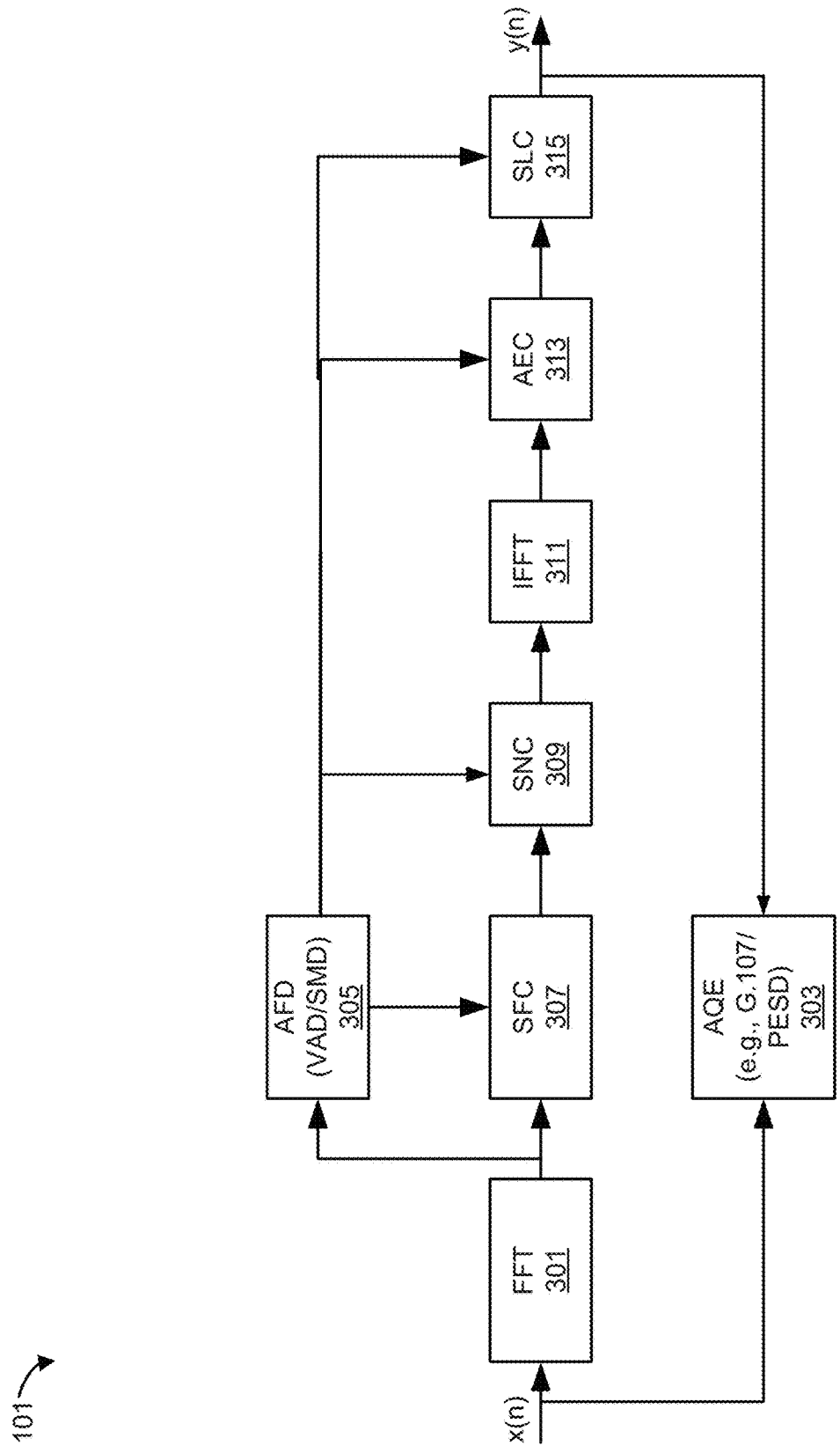
FIG. 3 is a block diagram of a smart voice enhancement engine.

In some implementations, a media bug 109 may include a dynamic library that provides an interface between one or more of the client devices 103, the smart voice enhancement engine 101, the audio mixer 111, the switch 107, and one or more other components of the telephony engine 105, such as a management interface (not shown). The audio mixer 111 may adjust volume levels, tones, or other elements of an audio signal, or perform other operations, depending on the implementation. The management interface may provide configuration and parameter setup for the modules smart voice enhancement engine 101, such as are shown in FIG. 3.

In some implementations, the smart voice enhancement engine 101 may include a library implemented on top of the switch 107 platform, but independent of the switch 107 as a stand-alone library. The smart voice enhancement engine 101 may operate on the server 115, although it is possible for it to operate on one or more of the client devices 103 without departing from the scope of this disclosure. The smart voice enhancement engine 101 may improve voice quality in a communication system by removing impairments such as noise and echo in telephony applications.

One or more of the components of the telephony engine 105 (e.g., the switch 107, media bug 109, audio mixer 111, or smart voice enhancement engine 101) may include software including logic executable by a processor to perform their respective acts, although the component may be implemented in hardware (e.g., one or more application specific integrated circuits (ASICs) coupled to a bus for cooperation and communication with the other components of the telephony engine 105 and/or network architecture 100; sets of instructions stored in one or more discrete memory devices (e.g., a PROM, FPROM, ROM) that are coupled to a bus for cooperation and communication with the other components of the system; a combination thereof, etc.).

Figure 2:
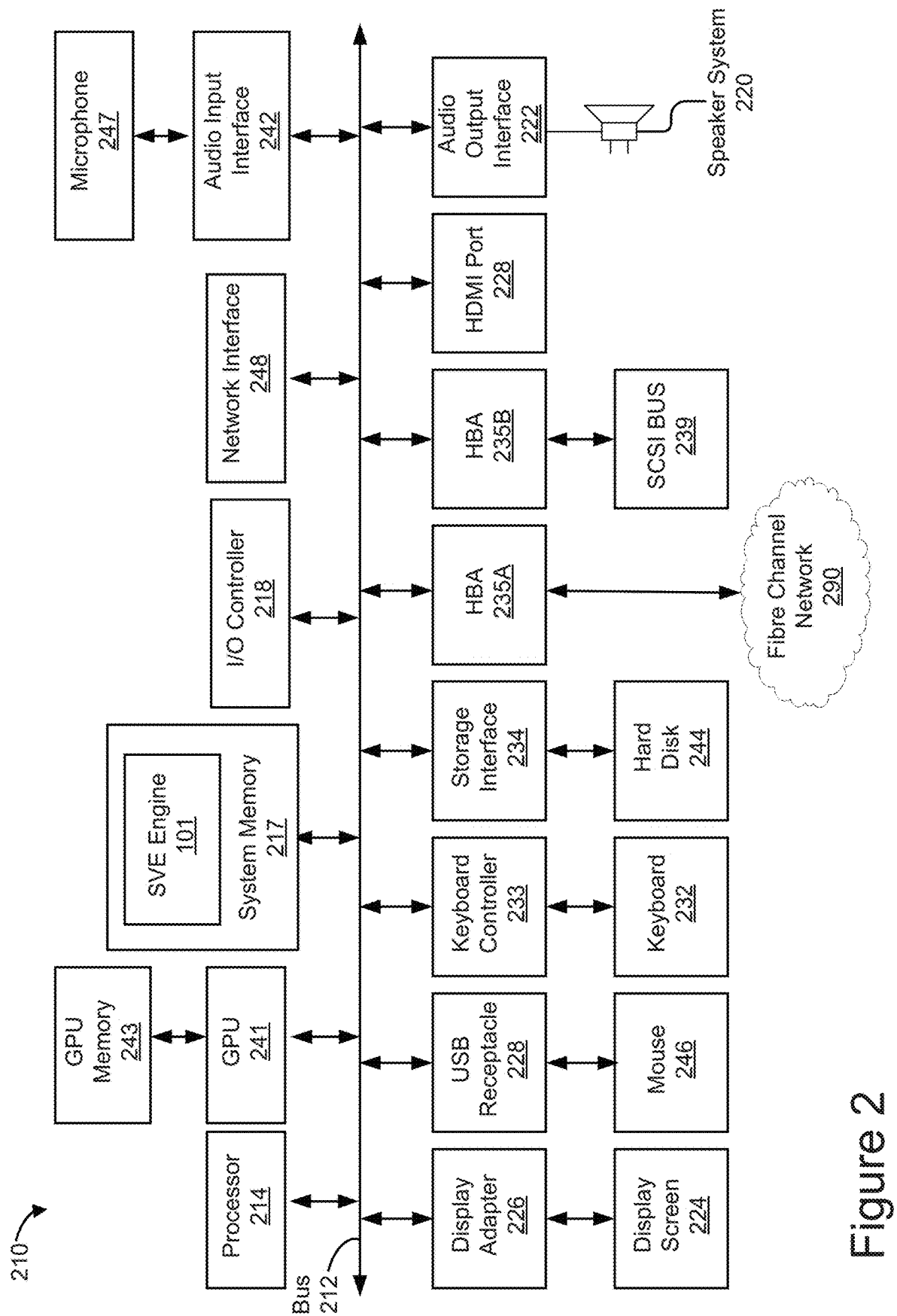
FIG. 2 is a block diagram of a computer system suitable for implementing a smart voice enhancement and noise cancellation system.

FIG. 2 is a block diagram of a computer system 210 suitable for implementing a smart voice enhancement and noise cancellation system. For instance, the computer system 210 may represent a server 115, which may execute the operations of the smart voice enhancement engine 101. Endpoints 103 and servers 115 can be implemented in the form of such computer systems 210. As illustrated, one component of the computer system 210 is a bus 212. The bus 212 communicatively couples other components of the computer system 210, such as at least one processor 214, system memory 217 (e.g., random access memory (RAM), read-only memory (ROM), flash memory), a graphics processing unit (GPU) 241, GPU memory 243, an input/output (I/O) controller 218, an audio input interface 242 communicatively coupled to an audio input device such as a microphone 247, an audio output interface 222 communicatively coupled to an audio output device such as a speaker 220, a display adapter 226 communicatively coupled to a video output device such as a display screen 224, one or more interfaces such as Universal Serial Bus (USB) ports 228, High-Definition Multimedia Interface (HDMI) ports 230, serial ports (not illustrated), etc., a keyboard controller 233 communicatively coupled to a keyboard 232, a storage interface 234 communicatively coupled to one or more hard disk(s) 244 (or other form(s) of storage media), a host bus adapter (HBA) interface card 235A configured to connect with a Fiber Channel (FC) or other network 290, an HBA interface card 235B configured to connect to a SCSI bus 239, a mouse 246 (or other pointing device) coupled to the bus 212, e.g., via a USB port 228, and one or more wired and/or wireless network interface(s) 248 coupled, e.g., directly to bus 212.

Other components (not illustrated) may be connected in a similar manner (e.g., document scanners, digital cameras, printers, etc.). Conversely, all of the components illustrated in FIG. 2 need not be present (e.g., smartphones, tablets, and some servers typically do not have external keyboards 242 or external pointing devices 246, although various external components can be coupled to mobile computing devices via, e.g., USB ports 228). In different implementations the various components can be interconnected in different ways from that shown in FIG. 2.

The bus 212 allows data communication between the processor 214 and system memory 217, which, as noted above may include ROM and/or flash memory as well as RAM. The RAM is typically the main memory into which the operating system and application programs are loaded. The ROM and/or flash memory can contain, among other code, the Basic Input-Output system (BIOS) which controls certain basic hardware operations. Application programs can be stored on a local computer readable medium (e.g., hard disk 244, solid state drive, flash memory) and loaded into system memory 217 and executed by the processor 214. Application programs can also be loaded into system memory 217 from a remote location (i.e., a remotely located computer system 210), for example via the network interface 248. In FIG. 2, the smart voice enhancement engine 101 is illustrated as residing in system memory 217. The workings of the smart voice enhancement engine 101 are explained in greater detail below.

The storage interface 234 is coupled to one or more hard disks 244 (and/or other standard storage media). The hard disk(s) 244 may be a part of computer system 210, or may be physically separate and accessed through other interface systems.

The network interface 248 can be directly or indirectly communicatively coupled to a network such as the Internet, a PSTN, etc. Such coupling can be wired or wireless.

FIG. 3 illustrates an example smart voice enhancement engine 101. As described above, the functionalities of the smart voice enhancement engine 101 can reside on specific computers 210 (endpoints 103, servers 115) or be otherwise distributed between multiple computer systems 210, including within a cloud-based computing environment in which the functionality of the smart voice enhancement engine 101 is provided as a service over a network. It is to be understood that although the smart voice enhancement engine 101 is illustrated in FIG. 3 as a single entity with several components, the illustrated smart voice enhancement engine 101 represents a collection of functionalities, which can be instantiated as a single or multiple modules as desired (an instantiation of an example multiple module smart voice enhancement engine 101 is illustrated in FIG. 3). It is to be understood that the modules of the smart voice enhancement engine 101 can be instantiated (for example as object code or executable images) within the system memory 217 (e.g., RAM, ROM, flash memory) (and/or the GPU memory 243) of any computer system 210, such that when the processor(s) 214 (and/or the GPU 241) of the computer system 210 processes a module, the computer system 210 executes the associated functionality. In some implementations, the GPU 241 can be utilized for some or all of the processing of given modules of the smart voice enhancement engine 101. In different implementations, the functionality of some or all of the modules of the smart voice enhancement engine 101 can utilize the CPU(s) 214, the GPU 241, or any combination thereof, as well as system memory 217, GPU memory 243, or any combination thereof as desired.

As used herein, the terms "computer system," "computer," "endpoint," "endpoint computer," "server," "server computer," and "computing device" mean one or more computers configured and/or programmed to execute the described functionality. Additionally, program code to implement the functionalities of the smart voice enhancement engine 101 can be stored on computer-readable storage media. Any form of tangible computer readable storage medium can be used in this context, such as magnetic, optical or solid state storage media. As used herein, the term "computer readable storage medium" does not mean an electrical signal separate from an underlying physical medium.

The smart voice enhancement engine 101 may use speech signal processing algorithms to enhance voice quality for VoIP, wireless, and PSTN telephony applications. As shown in the example illustrated in FIG. 3, the smart voice enhancement engine 101 may include a Fast Fourier Transform (FFT) module 301, smart feedback cancellation (SFC) module 307, inverse Fast Fourier Transform (IFFT) module 311, smart noise cancellation (SNC) module 309, acoustic echo cancellation (AEC) module 313, smart level control (SLC) module 315, audio quality evaluation (AQE) module 303, and/or an audio feature detection (AFD) module 305. In some implementations, although not illustrated in FIG. 3, the smart voice enhancement engine 101 may include functionality instantiating a voice activity detection algorithm (not shown), which may be incorporated or communicatively coupled with the audio feature detection module 305.

Depending on the implementation, the FFT module 301 may convert an original time domain signal $\{y(n)\}$ to a frequency domain. An audio feature (e.g., a noise or voice activity) detection module 305 may operate in the frequency domain and may employ the fact that the frequency spectrum for noise tends to be flat. The other modules (e.g., 307, 309, 311, 313, or 315) may use the output of the audio feature detection module 305 to identify music, speech, or noise.

The smart noise cancellation module 309 may remove ambient noise in the frequency domain, so that the listener feels more comfortable when listening to the speech with the noise removed. In some implementations, the smart noise cancellation module 309 may use an approach for a priori signal-to-noise ratio estimate using three smoothing factors ($\alpha,\beta,\mu$), although additional or fewer smoothing factors may be used in other implementations. For example, the smart noise cancellation module 309 may use three smoothing factors ($\alpha,\beta,\mu$) to provide better noise cancellation performance in terms of PESQ scores (e.g., determined by the audio quality evaluation module 303, described below). It should be noted that, depending on the specific circumstances of the audio signal, different smoothing factors may be used. For example, in a decision-direct approach containing only one smoothing factor $\alpha$, a small $\alpha$ may be preferred for stationary noise, while a relatively larger $\alpha$ performs better at noise cancellation for non-stationary noise. Depending on the implementation, the smart noise cancellation module 307 may use three different smoothing factors, thereby providing more options to achieve better noise reduction performance.

The IFFT module 311 may convert the frequency domain signal back to time domain by using the Inverse Fast Fourier Transform. The acoustic echo cancellation module 313 and smart level control module 315 may operate in the time domain to cancel acoustic echo and control audio volume levels, respectively.

The audio quality evaluation module 303 may use objective voice quality measurement algorithms to monitor smart voice enhancement for the audio signals before and after smart voice enhancement. In some implementations, the audio quality evaluation module 303 may use ITU (International Telecommunications Union) standards for quality assessment, such as a G.107 E-model and/or a Perceptual Evaluation of Speech Quality (PESQ) test(s) to monitor quality of the audio signal. For example, the audio quality evaluation module 303 may compare speech output in the outgoing audio signal with original clean audio in the incoming audio signal in order to get a mean opinion score (MOS). In some implementations, the G.107 E-model in the audio quality evaluation module 303 may provide real-time and non-intrusive voice quality measurement, for example, in terms of the MOS value for each call. The MOS may represent a score of ratings gathered in a quality evaluation test, which may be manually or algorithmically performed.

Figure 4:
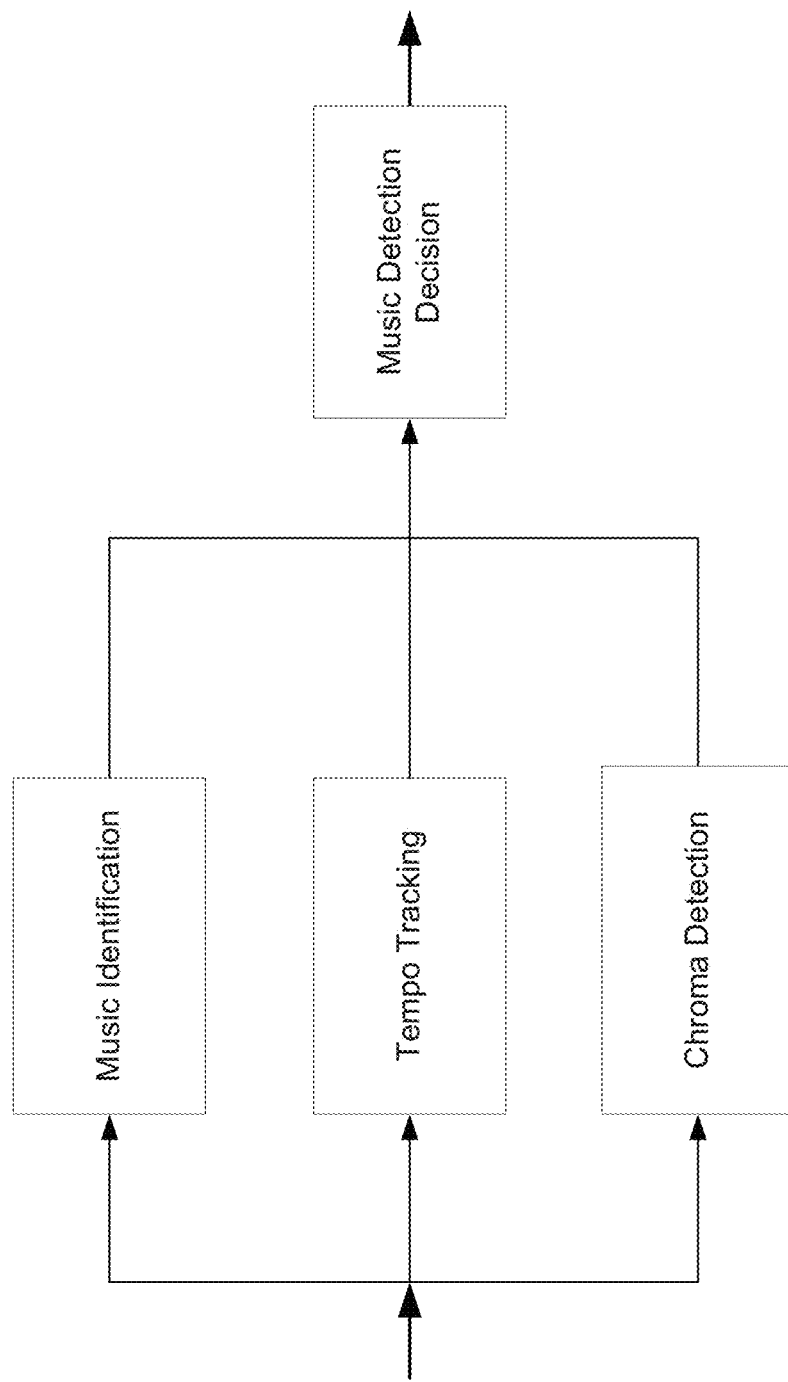
FIG. 4 is a block diagram of a smart music detection module.

AFD module 305 may include a voice activity detection (VAD) module. The VAD module ma operated in the frequency domain and employ the fact that the frequency spectrum for noise tends to be flat. The AFD module 305 may also include a smart music detection module. FIG. 4 illustrates a module for smart music detection (SMD). The Smart Music Detection (SMD) module consists of three detectors: music identification (MI), tempo tracking (TT), and chroma detection (CD) as shown in FIG. 4. Each music detector uses different technologies and serves different purposes since there are many kinds of music. These three detectors work in parallel to achieve music detection for all kinds of music in very short time in telephony applications, e.g., in half seconds, or two seconds.

The music identification method detects music by comparing the incoming music data in real time with that stored in the SVE system. MI has the advantage to tell precisely which music piece is present in the phone call. However, music pieces must be stored in the SVE system in order to be identified in real time. The chroma detection method works well under the condition that chroma shows up consistently in the incoming audio packets. If in consecutive multiple frames chroma shows up consistently, then a music event is declared. Based on extensive experiments, it shows that the CD algorithm can detect a majority of music genres in a very short time, e.g., in half seconds, or two seconds. The tempo tracking method works well for percussion music. As long as consistent tempo shows up, then the TT algorithm detects the tempo and music is declared to be present. Consistent tempo normally shows up in percussion music such as those with piano, guitar, drum, bell, cymbal, gong, timpani, xylophone, etc.

For most music examples, both chroma and tempo exist at the same time. Then at the earliest time when music is detected by either detector, SVE makes the decision to bypass it in order to deliver perfect music to the end users. This way, music degradation does not occur after the SVE processing such as noise cancellation. In this scenario, both chroma detection and tempo tracking methods complement each other. It is worth noticing that there are many music examples that chroma is lacking, but tempo shows up consistently, e.g., certain genres of percussion music. The sound of different drums shows a burst of energy, without enough chroma signatures. This leaves tempo tracking as the only efficient detector in real time for this scenario.

Figure 5:
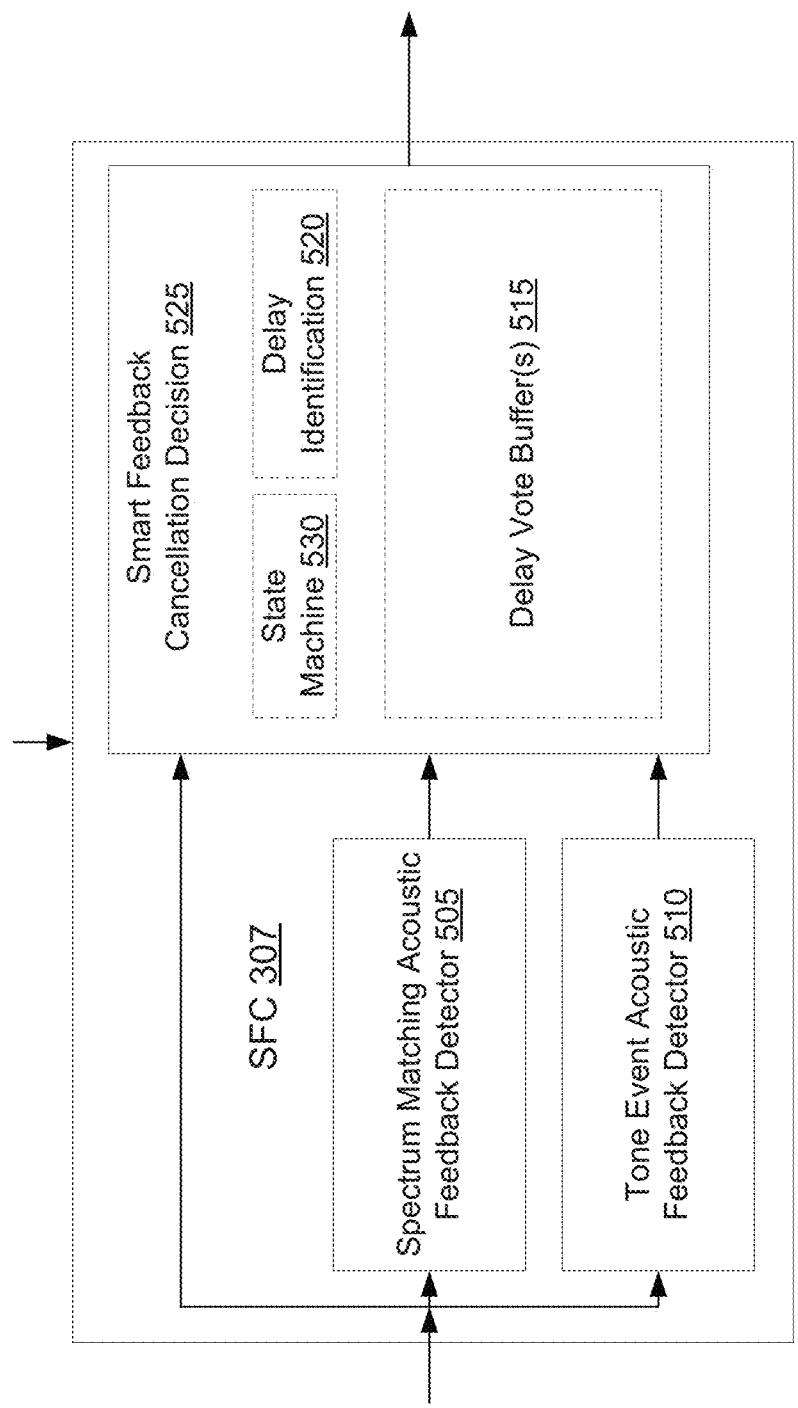
FIG. 5 is a block diagram of a smart feedback control module, in accordance with some implementations.

FIG. 5 illustrates an example of submodules in an example implementation of SFC module 307. As will be described in greater detail below, two types of primary detection may be used to identify acoustic feedback.

A spectrum matching acoustic detector 505 detects a spectral energy pattern similarity between two or more frames. For example, in the time domain, acoustic feedback may correspond to a howling sound that repeats with a nearly constant delay. The magnitude of the spectral energy pattern of individual acoustic bursts may vary in different frames, but some aspects of the spectral pattern may repeat in two or more frames. Additional detail on a normalized distance of the signal spectral energies for identifying similar spectral patterns independent of magnitude is described below in more detail. In some implementations, the normal distance is customized in regards to frequency components associated with the howling effect.

A tone event acoustic feedback detector 510 detects attributes of a spectral energy for tone events. For example, there may be instrumental or sung music that includes tones and overtones that trigger acoustic feedback.

The two detectors 505 and 510 analyze spectral energy characteristics of frames looking for characteristics of two or more frames that match that of a howling effect generated by acoustic feedback. As discussed below in more detail, various optimizations may be performed to optimize the manner in which a detection of a match is used to make a reliable decision regarding when to automatically mute or cancel the sound early enough to prevent the howling effect from resulting in an acoustic feedback growing to an amplitude level and duration that is disturbing for users.

A smart feedback cancellation decision module 525 generates decisions on when to mute the sound. However, to improve the reliability with which muting decision are made, additional features may be included. A delay identification test 520 may be included to identify a consistent delay. Acoustic feedback tends to quickly converge to a consistent delay associated with the feedback of a closed loop path. Performing a delay identification test 520 improves reliability. In some implementations, the detectors 505 and 510 generate delay votes, which are stored in one or more delay vote buffers 515, with the accumulated delay votes used to determine when to advance states of a state machine 530. As will be described below in more detail, the architecture, voting algorithms and state machine may be designed to achieve a good balance of objectives such as converging on a reliable decision that there is acoustic feedback in a reasonable number of frames, muting the acoustic feedback, and then ceasing the mute function when the acoustic feedback ceases.

Additional details of operation will now be described.

II. Introduction to Speech Signal Processing

The smart voice enhancement engine 101 (e.g., the FFT module 301) may perform Fast Fourier Transform framing with a windowing function. Thus, the SFC module 307 receives the FFT of a sequence of frames, and makes decisions whether or not to mute or cancel one or more frames before these frames are further processed and converted back into the time domain in IFFT module 311.

The discrete Fourier transform (DFT) of the time-domain signal $\{x(n)\}$ is given as follows:

$$X(m,k) = \sum_{n=0}^{N-1} x(n + mH)w(n)e^{-j2\pi kn/N}, \ 0 \le k \le N-1, \quad \text{Eq. 1}$$

where m is the frame number, k is the frequency bin, H is the frame hop size, N is the fast Fourier transform (FFT) size, w(n) is the window function, $n \in [0, N-1]$. Typical window functions may include rectangular, Bartlett, Hanning, Hamming, Blackman, and Kaiser windows, etc.

The inverse DFT, implemented by IFFT module 311, is given by:

$$x(n + mH) = \frac{1}{N}\sum_{k=0}^{N-1} X(m,k)e^{j2\pi kn/N}, \ 0 \le n \le N-1, \quad \text{Eq. (2)}$$

for the m-th frame.

In a DFT, Eq. (1), the frequency bin k corresponds to the physical frequency:

$$F_{coef}(k) = k * \frac{F_s}{N}, \ 0 \le k \le N, \quad \text{Eq. (3)}$$

This is expressed in Hz, where $F_s$ is the sampling frequency in Hertz (Hz), and N is the FFT size.

In public switched telephone network (PSTN), the sampling rate is fixed at $F_s$=8000 Hz, resulting in maximum speech bandwidth 4000 Hz based on sampling theorem. This is the narrow-band (NB) case. This sampling rate is also used in voice-over-internet (VoIP) and wireless cellular networks, as long as the following speech codecs are used: G. 711 (a-law and μ-law), G.729, G.723, G.726, AMR, GSM, GSM-HR, GSM-FR, etc. The wide-band (WB) sampling rate $F_s$=16000 Hz with efficient signal bandwidth 8000 Hz. The WB coder includes AMR-WB and G.722. The full-band (FB) sampling rate $F_s$=48000 with efficient signal bandwidth up to 24000 Hz, including Opus codec.

In the case of NB, N=256 points FFT has minimum granularity 8000/256=31.25 Hz based on (5) for the N bins. This is also true for WB with N=512. In the case of FB, N=1024 points FFT has minimum granularity 48000/1024=46.875 Hz.

Without loss of generality, the principals of the disclosure may be illustrated using NB. The WB and FB cases will be explained as well when necessary. FIG. 6 is a table of critical band bin distribution for NB 256-point FFT. FIG. 7 is a table illustrating the critical band bin distribution for FB 1024-point FFT.

In the voice spectrum, the critical bands are defined by the Bark scale: 100 Hz, 200 Hz, 300 Hz, 400 Hz, 510 Hz, 630 Hz, 770 Hz, 920 Hz, 1080 Hz, 1270 Hz, 1480 Hz, 1720 Hz, 2000 Hz, 2320 Hz, 2700 Hz, 3150 Hz, 3700 Hz, 4400 Hz, 5300 Hz, 6400 Hz, 7700 Hz, 9500 Hz, 12000 Hz, and 15500 Hz. In the case of NB, WB, and FB, there are eighteen, twenty-two, twenty-five critical bands, respectively.

The signal power spectral density (PSD) estimate for the i-th critical band is given by:

$$E(m,i) = \alpha E(m-1,i) + (1-\alpha)\frac{1}{CB_H(i) - CB_L(i) + 1}\sum_{k=CB_L(i)}^{CB_H(i)} |X(m,k)|^2, \quad \text{Eq. (4)}$$

where $0 \le i < N_c$, α is a smoothing factor, $0 \le \alpha < 1$, $N_c$ is the number of total critical bands, and $CB_H(i)$ and $CB_L(i)$ are the highest and lowest FFT bins for the i-th critical band, respectively. Typical choice of α includes α=0.55, α=0.45, α=0.25, and α=0.1. $N_c$=18, 22, and 25 for NB, WB, and FB with 256, 512, and 1024 points FFT respectively. In the case of NB with 256-point FFT, $CB_H(i)$ and $CB_L(i)$, $0 \le i < N_c$ are provided in the Table 1 of FIG. 6 for reference. In Table 1, the $2^{nd}$ and the $3^{rd}$ columns are the frequency bins. Similarly, for FB with 1024-point FFT, $CB_H(i)$ and $CB_L(i)$, $0 \le i < N_c$ are provided in the Table 2 of FIG. 7 for reference.

The dB value of the signal spectral energy for the i-th critical band is defined by:

$$EdB(m,i) = 10\log_{10}E(m,i), 0 \le i < N_c. \quad \text{Eq. (5)}$$

The total signal energy in dB based on all critical bands is given by:

$$EdB_{total}(m) = 10\log10\left(\sum_{i=0}^{N_c-1} E(m,i)\right), \quad \text{Eq. (6)}$$

for the m-th frame.

The half-wave rectification function is defined as follows:

$$|x|_{\ge 0} = \begin{cases} x, & \text{if } x \ge 0 \\ 0, & \text{otherwise} \end{cases} \quad \text{Eq. 7}$$

To detect the signal onset of speech, music note, and acoustic feedback, we need to define the spectral novelty function. We first calculate the averaging temporal difference of the signal spectral energy in logarithmic domain per critical band:

$$\varphi(m,i) = \lambda\varphi(m-1,i) + (1-\lambda)|EdB(m,i) - EdB(m-1,i)|_{\ge 0}, \quad \text{Eq. (8)}$$

where $0 \leq i < N_c$, $\lambda$ is a smoothing factor, $0 \leq \lambda < 1$, EdB(m,i) is defined in Eq. (5), and $|x|_{\geq 0}$ is defined in Eq. (7). Typical $\lambda$ includes $\lambda=0.98$, $\lambda=0.9667$, and $\lambda=0.9$.

The spectral novelty function is defined as follows:

$$\Gamma(m) = \sum_{i=0}^{N_c-1} \||EdB(m,i) - EdB(m-1,i)|_{\geq 0} - \varphi(m,i)|_{\geq 0} \quad \text{Eq. (9)}$$

It is worth noticing that the spectral novelty function Eq. (9) is defined using power spectral density (PSD) per critical band, which is in comparison with that defined using all frequency bins. It is expected to obtain more reliable onset detection results because of the averaging operation in Eq. (4)-Eq. (5). The spectral novelty function Eq. (8)-Eq. (9) is calculated using the first-order difference of the power spectral density per critical band in logarithmic domain.

III. Acoustic Feedback Detector by Spectrum Matching

The spectrum matching acoustic feedback detector 505 may be implemented in different ways. An efficient algorithm for performing acoustic feedback detection by spectrum matching is now described.

To measure the similarity of signal spectrum, we introduce $L_1$ which is distance of the signal spectral energy in dB domain. From (5), for different frame numbers m and p, the dB values of the signal spectral energy for all critical bands are given by:

$$EdB(m,i) = 10 \log 10(E(m,i)), EdB(p,i) = 10 \log 10(E(p,i)), 0 \leq i < N_c.$$

The distance between $\{EdB(m,i), 0 \leq i < N_c\}$ and $\{EdB(p,i), 0 \leq i < N_c\}$ can be defined as follows:

$$U(m,p) = \sum_{i=N_0}^{N_c-1} |EdB(m,i) - EdB(p,i)|, \quad \text{Eq. (10)}$$

where $N_0=0$ means that the signal spectral energy in dB for all critical bands is included to calculate U(m,p), while $N_0>0$ means that the signal spectral energy in dB for the first $N_0$ critical bands is not included for the calculation. For howling frequency components, the main concern is above low frequency range, e.g., above 300 Hz, which is when acoustic feedback occurs. This motivates a decision to choose $N_0>0$ to ignore low frequency components. In the case of narrow band (NB), typical No may be chosen in a range [0, 7].

The distance measurement of Eq. (10) has the drawback that different magnitudes generate big metrics, even if with same signal spectrum patterns. However, for acoustic feedback cancellation, one goal is to detect similar signal spectrum patterns, but without the influence of signal magnitude. To this end, the mean of the difference may be calculated:

$$\mu(m,p) = \frac{1}{N_c - N_0} \sum_{i=N_0}^{N_c-1} |EdB(m,i) - EdB(p,i)|, \quad \text{Eq. (11)}$$

for frame m and p. The $L_1$-distance of the signal spectral energy in dB domain is then defined as the following normalised version with respect to the mean:

$$D(m,p) = \sum_{i=N_0}^{N_c-1} \||EdB(m,i) - EdB(p,i)| - \mu(m,p)|. \quad \text{Eq. (12)}$$

The $L_1$-distance D(m,p) is useful for acoustic feedback cancellation because it can measure the spectrum similarity with immunity to magnitude changes. If at frame p, the signal spectrum pattern is a magnitude changed version of that at frame m, i.e., $E(p,i)=c \, E(m,i)$, $0 \leq i < N_c$ for some constant $c>0$, then D(m,p)=0.

When acoustic feedback happens, the signal tends to have more energy on the higher frequency components than that in the low frequency range, generating an annoying sound. This means that for detecting acoustic feedback we are interested in the ratio of the spectral energies between high and low frequencies. This can be obtained in a total-to-low (TTL) ratio in the domain as follows:

$$EdB_{ratio}(m) = EdB_{ratio}(m) - 10\log 10 \left( \sum_{i=0}^{N_1-1} E(m,i) \right), \quad \text{Eq. (13)}$$

where $EdB_{total}(m)$ is given by (6), and $N_1$ is a small constant. For example, $N_1$ may be chosen in a range [3, 7] for the narrow band case.

Figure 8:
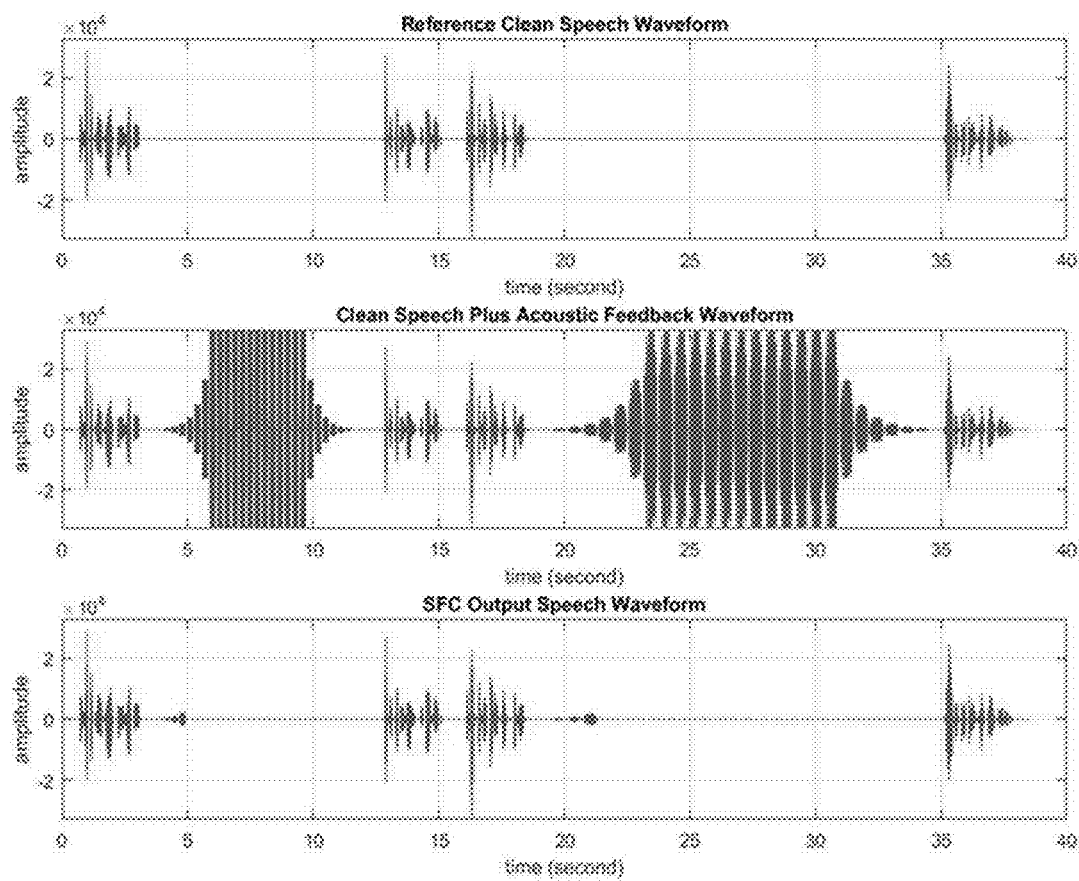
FIG. 8 illustrates a clean speech waveform (top), a clean speech waveform with two episodes of acoustic feedback (middle). and how smart feedback control mutes the acoustic feedback (bottom).

FIG. 8 shows two bursts of acoustic feedback sound, with delay 300 ms and 600 ms respectively. Suppose the SVE framing time is 10 ms. This corresponds to a delay of 30 and 60 frames, respectively for the 300 ms and 600 ms delay. The $2^{nd}$ burst of acoustic feedback sound is plotted in FIG. 9.

Figure 9:
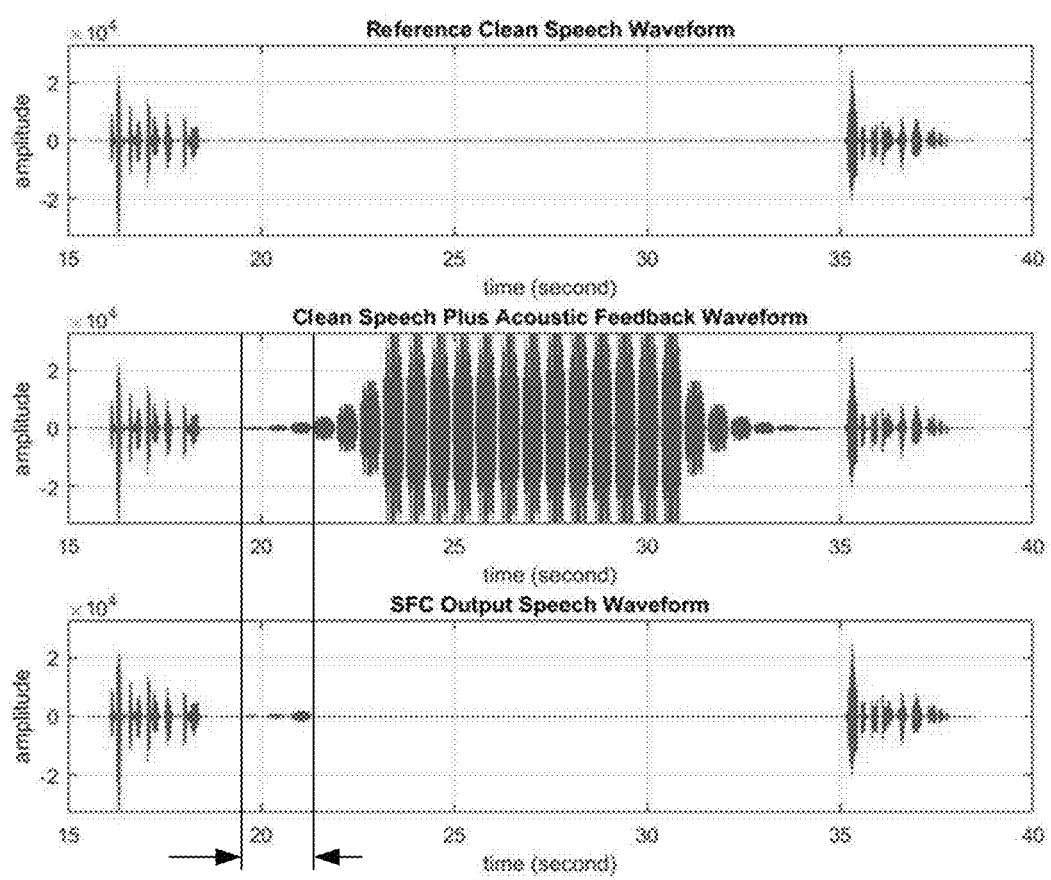
FIG. 9 is a detailed view of a portion of FIG. 8.
Figure 10:
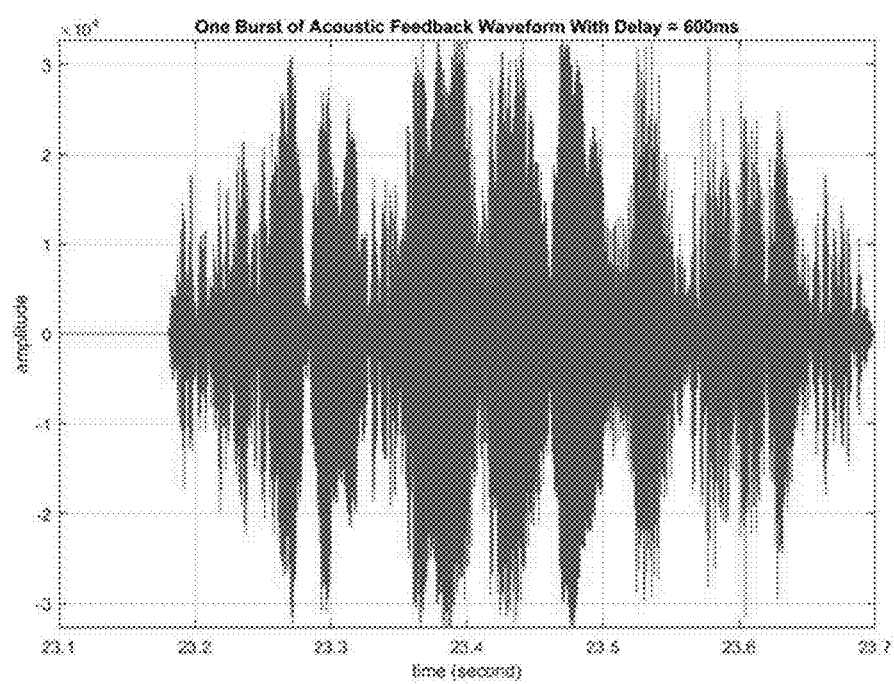
FIG. 10 illustrates an example of one burst of an acoustic feedback waveform.

As seen in FIG. 9, acoustic feedback sound with delay 60 frames repeats itself, with or without magnitude changes. In general, we are interested in the delay range $[L_{min}, L_{max}]$, where $L_{min}$ and $L_{max}$ represents minimal and maximal possible round-trip delay in terms of SVE framing time 10 ms in the voice-over-TP (VoIP) system. For example, one configuration is $L_{min}=20$ and $L_{max}=130$, representing minimal and maxima delay of 200 ms and 1.3 seconds respectively. One burst of acoustic feedback waveform with delay 600 ms is given in FIG. 10 for reference.

As illustrated in FIG. 9, by the vertical lines focusing on a section of the middle and bottom graphs, one objective of SFC is to automatically make a decision to mute the sound amplitude before the acoustic feedback builds up to an extent of being a high amplitude howling sound that is a nuisance to user.

To make a conclusion that the audio signal of the current $L_{max}$ frames audio has a similar sound to the precious $L_{max}$ frames audio in real-time, a comparison can be made between the spectral energy of each frame with that of precious $L_{max}$ frames. This results in $O(L_{max}^2)$ operations. A search method which requires only $O(L_{max})$ operations is described below.

For each frame, there are $N_c$ spectral energies for each critical band to store. We first define two arrays in the C language:

float $EdB\_ref[L_{max}+1][N_c]$;

int delayVote[$L_{max}+1$];

The first array EdB_ref[ ][ ] stores ($L_{max}+1$) frames of spectral energies for all $N_c$ critical bands in physical memory. The second buffer delayVote[ ] stores votes for the delay estimate that we will describe later on. The $1^{st}$ buffer is a cyclic buffer. Suppose that p is the current frame number of the first index in the array EdB_ref[p][ ]. The index p representing the current frame number starts from 0, increases one for each frame until reaching $L_{max}$. After that, it resets itself to 0, and then repeats the above procedure.

For the current frame p, the $N_c$ critical band spectral energies are stored in the array EdB_ref[p][ ], where $0 \le p \le L_{max}$. For frame $p \in (0, L_{max})$, frame q=p-1 in this array represents previous frame with delay=1, while frame q=p+1 represents the oldest frame with delay=$L_{max}$ since the spectral energies for the next frame will be stored there. Assuming that the current frame number is p, then the delay from index q to p is determined as follows:

$$delayIdx = \begin{cases} p - q, & \text{if } q \le p \\ p - q + L_{max} + 1, & \text{otherwise.} \end{cases} \quad \text{Eq. (14)}$$

We now describe the conditions ($C_i$) that the spectrum pattern matches for frames p and q:

C0) The $L_1$-distance D(p, q) defined by Eq. (12) in dB domain is small enough, i.e., $$D(p,q) \le \Delta_0, \quad \text{Eq. (15)}$$

where $\Delta_0$ is a small constant. For example, we may choose $\Delta_0 = \eta_0(N_c - N_0)$, where $\eta_0 \in (0, 2]$ is a constant.

C1) The total-to-low (TTL) ratio defined by Eq. (13) is big enough for both frames p and q, i.e., $$EdB_{ratio}(m) \ge \Delta_1, \quad \text{Eq. (16)}$$

for both m=p and m=q, where $\Delta_1$ is a constant, e.g., a constant in a range [9 dB, 20 dB].

C2) The total signal spectral energy defined by Eq. (6) is big enough for both frames p and q, i.e., $$EdB_{total}(m) \ge \Delta_2, \quad \text{Eq. (17)}$$

for both m p and m q, where $\Delta_2$ is a constant representing the signal energy in dB (e.g., -55 dB, -60 dB, or -65 dB).

For the current frame p, conditions C0)-C2) are verified for all other previous frames q, $0 \le q \le L_{max}$. If the above conditions C0)-C2) are satisfied for frame q, then the signal spectrum matches with respect to the delay index Eq. (14). In this case, one vote is added in the delay vote buffer corresponding to the delay index:

$$delayVote[delayIdx] += 1. \quad \text{Eq. (18)}$$

Since frame number q changes from 0 to $L_{max}$, the search process (for a detector using signal spectrum matching) can be completed using only $O(L_{max})$ operations.

IV. Acoustic Feedback Detector by Identifying Tone Events

The tone event acoustic feedback detector 510 may be implemented in different ways. An efficient algorithm will now be described to detect attributes of tone events, which may, for example, include spectral energy spikes.

We begin by finding the FFT bin with the maximal magnitude for frame m $$i_0 = \underset{0 \le k \le N/2}{\operatorname{argmax}} |X(m, k)|^2. \quad \text{Eq. (19)}$$

Excluding FFT bins [$i_0-1$, $i_0+1$], we find the FFT bin with the next maximal magnitude among all other FFT bins:

$$i_1 = \underset{k \notin [i_0-1, i_0+1]}{\operatorname{argmax}} |X(m, k)|^2. \quad \text{Eq. (20)}$$

In the following, a method to identify tone events when acoustic feedback happens is now described. Define:

$$S(m) = \sum_{k=0}^{N/2} [X(m, k)]^2, \quad \text{Eq. (21)}$$

$$S_0(m) = \sum_{k=i_0-1}^{i_0+1} [X(m, k)]^2, \quad \text{Eq. (22)}$$

where N is the FFT frame size, S(m) is the sum of the spectral energy over all FFT bins from 0, 1, ..., N/2. $S_0(m)$ represents the spectral energy around FFT bin $i_0$.

Suppose that $|i_1 - i_0| \ge 3$. In this case, $i_1$ and $i_0$ are separated apart with a distance of at least 3 FFT bins. There are two disjoint maxima. Define $$S_1(m) = \sum_{k=i_1-1}^{i_1+1} |X(m, k)|^2, \quad \text{Eq. (23)}$$

where $S_1(m)$ represents the spectral energy around FFT bin $i_1$.

It is noted that in the case of narrow band (NB) with 256-point FFT, three FFT bins have bandwidth 3*31.25=93.75 Hz. This is equivalent to 2 FFT bins for full band (FB) with 1024-point FFT. Therefore, for full band case, only two FFT bins are used in Eq. (20), Eq. (22), and Eq. (23). The FFT bin is chosen with the maximal value between $|X(m, i_0-1)|^2$ and $|X(m, i_0+1)|^2$, and the FFT bin with the maximal value between $|X(m, i_1-1)|^2$ and $|X(m, i_1+1)|^2$, respectively.

The spectral energy is defined for all background FFT bins except the two maxima related FFT bins:

$$T(m) = S(m) - S_0(m) - S_1(m), \quad \text{Eq. (24)}$$

for frame m.

In order for the FFT bin $i_0$ to qualify as a tone event, the following criterion is introduced for the maximal-to-background (MTB) comparison:

H0) The FFT bin $i_0 \ge$ MIN_BIN, where MIN_BIN is a constant (e.g., 12 for narrow band), and $$10 \log_{10} S_0(m) - 10 \log_{10} T(m) \ge \Delta_3(i_0), \quad \text{Eq. (25)}$$

where $\Delta_3(i_0)$ is a threshold depending on $i_0$. For example, we may choose $$\Delta_3(k) = \begin{cases} 5 \text{ dB}, & \text{if } k > \text{MID\_BIN} \\ 6.5 \text{ dB}, & \text{otherwise} \end{cases} \quad \text{Eq. (26)}$$

where MID_BIN is a constant (e.g., MID_BIN=34 corresponding to 1062.5 Hz for narrow band).

To store the detection results in physical memory, two arrays in the C language are defined:

Int toneBuf[$L_{max}$+1],toneBuf2[$L_{max}$+1].

Let p be the index for a cyclic buffer with length $L_{max}$+1, representing current frame number. If condition H0) is satisfied for some frame p, we set toneBuf[p]=$i_0$;

otherwise, we set toneBuf[p]=-1, where -1 means there is no valid tone event.

Similarly, replacing $10 \log_{10} S_0(m)$ by $10 \log_{10} S_1(m)$, we can obtain a verification condition for the $2^{nd}$ maximum at FFT bin $i_1$.

H1) The FFT bin $i_1 \geq \text{MIN\_BIN}$, where MIN_BIN is a constant defined in H0), and $$10 \log_{10} S_1(m) - 10 \log_{10} T(m) \geq \Delta_3(i_1), \qquad \text{Eq. (27)}$$

where $\Delta_3(k)$ is defined in Eq. (26).

If condition H1) is satisfied for some frame p, we set $$\text{toneBuf2}[p] = i_1;$$

otherwise, we set toneBuf2[p]=−1,

So far, the scenario has been discussed where $|i_1 - i_0| \geq 3$. Now consider the case that $|i_1 - i_0| < 3$. In this case, the FFT bins $i_1$ and $i_0$ are mingled together and there is only one distinguishable maximum at FFT bin $i_0$ where a tone event can happen. Define:

$$T(m) = S(m) - S_0(m), \qquad \text{Eq. (28)}$$

where $T(m)$ is the spectral energy for all background FFT bins except the maximum related FFT bins around $i_0$.

We proceed to use condition H0) to verify whether there is a tone event. If condition H0) is satisfied, then the index $i_0$ is saved in the physical memory toneBuf[ ] as stated before.

Suppose that p is the current frame and q is an index $0 \leq q \leq L_{max}$ representing a previous frame in a cyclic buffer. The delay index with respect to frames p and q is given by Eq. (14).

We introduce the following condition for tone event verification.

C3) Either all the following conditions are satisfied:

$$\text{toneBuf}[p] > 0, \text{toneBuf2}[q] > 0;$$

$$\text{toneBuf}[p] = \text{toneBuf}[q];$$

$$\text{toneBuf2}[p] = \text{toneBuf2}[q]$$

or all the following conditions are satisfied:

$$\text{toneBuf}[p] > 0, \text{toneBuf2}[q] = -1;$$

$$\text{toneBuf}[p] = \text{toneBuf}[q];$$

$$\text{toneBuf2}[p] = \text{toneBuf2}[q]$$

The first set of conditions state that there are two valid tone events, while the $2^{nd}$ set of conditions state that there is one valid tone event. Both sets of conditions require that the FFT bins identified as tone events are equal for both frames p and q.

Similar to condition C0), we introduce the following condition on the $L_1$-distance.

C4) The $L_1$-distance $D(p, q)$ defined by Eq. (12) in dB domain is small enough, i.e., $$D(p,q) \leq \Delta_4, \qquad \text{Eq. (29)}$$

where $\Delta_4$ is a small constant. For example, we may choose $\Delta_4 = \eta_1(N_c - N_0)$, where $\eta_1$ is a constant, $\eta_1 > \eta_0$. For example, we may choose $\eta_1 \in (0, 3]$.

For the current frame p, if the above conditions C2)-C4) are satisfied for some previous frame q, then a tone event with signal spectrum matching is identified with respect to the delay index Eq. (14). In this case, one vote is added in the delay vote buffer as in Eq. (18) corresponding to the delay index Eq. (14). Since frame number q changes from 0 to $L_{max}$, we finish the search process for tone event with signal spectrum matching using only $O(L_{max})$ operations.

V. Integration of Spectrum Matching Detector and Tone Event Detector

The SFC 307 may be implemented using the spectrum matching detector 505 without a tone event detector 510. The spectrum matching detector 505 addresses many common situations. However, the tone event detector 510 addresses some additional situations where there are frequency spikes associated with acoustic feedback for tones. Thus, in some implementations both types of detectors are used. Both types of detectors may be integrated together and used to generate delay votes that are buffered and used to generate information for determining when to mute or cancel acoustic feedback.

For fast convergence of the delay identification method that we describe later, we introduce double buffering for the delay vote buffer. First we define two different buffers, the associated pointers, the buffer index, and the hangover buffers in the C language:

$$\text{int tmpVote}[L_{max}+1], \text{tmpVote2}[L_{max}+1];$$

$$\text{int*}p\text{TmpVote}[2];$$

$$\text{short buf}Idx;$$

$$\text{short voteHangover}[2];$$

Initially, we set the two pointers to point to one of the buffers respectively, and set the buffer index bufIdx=0:

$$p\text{TmpVote}[0] = \& \text{ tmpVote}[0], p\text{TmpVote}[1] = \& \text{ tmpVote2}[0];$$

two buffers tmpVote[ ] and tmpVote2[ ] to store the votes as in Eq. (18). Only one buffer is active at any time, while the other is used for vote collection. We use the buffer index bufIdx to control which buffer is active to store the new votes. Every VOTING_INTERVAL frames, we change the buffer index bufIdx value from 0 to 1 or from 1 to 0 as follows:

$$\text{buf}Idx = (\sim \text{buf}Idx) \ \& \ 1; \qquad \text{Eq. (30)}$$

where VOTING_INTERVAL is a constant (e.g., 20, 25, or 30). In one implementation, the two acoustic feedback detectors 505 and 510 are integrated in such a way that both detectors contribute the votes to the double buffers, but only one vote is added if both detectors contribute one vote at the same time. If conditions C0)-C2) or C2)-C4) are satisfied, then one vote is added to the double buffers as seen below:

$$p\text{TmpVote}[\text{buf}Idx][\text{delay}Idx] \mathrel{+}= 1; \qquad \text{Eq. (31)}$$

$$\text{voteHangover}[\text{buf}Idx] = \text{HANGOVER\_LEN}; \qquad \text{Eq. (32)}$$

where HANGOVER_LEN is a constant (e.g., 5, 10, or 15). This hangover constant controls the time between the burstiness of the acoustic feedback sound and the vote collection time from the double buffers to the vote buffer delayVote[ ].

As seen in Eq. (31)-Eq. (32), when one vote is contributed to one of the double buffers, the hangover time associated with that buffer is set to a positive constant. Afterwards, if this hangover time is positive, we decrease it by one per frame:

$$\text{voteHangover}[\text{buf}Idx] = \text{voteHangover}[\text{buf}Idx] - 1; \qquad \text{Eq. (33)}$$

When the vote hangover time transits from 1 to zero, we collect the votes and perform the following operations:

1) Copy all votes from the active double buffer pTmpVote[bufIdx][ ] to the delay vote buffer delayVote[ ];
2) Reset the active double buffer pTmpVote[bufIdx][ ] to zero.

Since the burstiness of acoustic feedback sound may last $L_{max}$ frames, the vote hangover time is positive by Eq. (32) during this time. This prevents us from vote collection for a long time. So we add the regular buffer switching as in Eq. (30). VOTING_INTERVAL is the constant that controls how often we want the buffer switching to happen.

By double buffering technique, we can collect votes when acoustic feedback happens, meanwhile we can measure the delay from the votes in the delay vote buffer on the background.

VI. Delay Identification for Smart Feedback Cancellation

In one implementation, an acoustic feedback event is identified when enough votes are concentrated at one particular delay value. The acoustic feedback event constitutes states for a finite state machine (FSM) for smart feedback cancellation (SFC) that we will discuss later. The initial state of the finite state machine is state $S_0$.

When bursts of acoustic feedback (AF) sound repeat on the receiver buffer, the delay between two bursts has very little difference. The delay convergence is a powerful tool to identify the presence of an acoustic feedback sound. After an acoustic feedback sound occurs, it may grow quickly, such a goal of the delay identification method is to converge at a fast speed to prevent the acoustic feedback from growing into an annoying howling sound. However, it is also important that identification be reliable and not result in unnecessarily muting normal speech or music.

To describe the delay identification method, we first define the following variables, which in the C language are:

short $afDelay, afCount$;

Bool $cvgFlag, dvgFlag$;

In the above, afDelay is the delay measurement that the acoustic feedback signal repeats in the receiving buffer. afCount is an event count for the acoustic feedback sound. In one implementation, an acoustic feedback event means the presence of acoustic feedback sound due to the accumulation of delay votes. When the delay identification method converges, the convergence flag cvgFlag is set to TRUE. On the other hand, the divergence flag dvgFlag= TRUE means divergence of the delay identification method.

For every frame, we first find the maximum $V_{max}$ and the corresponding index $I_{max}$ in the delay vote buffer:

$$V_{max} = \max_{L_{min} \leq i \leq L_{max}} delayVote[i], \quad \text{Eq. (34)}$$

$$I_{max} = \max_{L_{min} \leq i \leq L_{max}} delayVote[i]. \quad \text{Eq. (35)}$$

If there are multiple delay values with the same maximum $V_{max}$, then we choose the delay closest to the previous measurement afDelay as $I_{max}$. The mean $V_{mean}$ of all votes in the delay vote buffer is defined as:

$$V_{mean} = \frac{1}{L_{max} - L_{min} + 1} \sum_{i=L_{min}}^{L_{max}} delayVote[i]. \quad \text{Eq (36)}$$

Let us check whether the vote distribution in the delay vote buffer passes the vote verification condition for an acoustic feedback event.

Suppose that the maximum value $V_{max}$>VOTE_MARGIN, where VOTE_MARGIN is a positive constant (e.g., 4, 5, or 6). If $V_{max} \leq$VOTE_MARGIN, then an acoustic feedback event is not found and this frame is passed for the following verifications.

First find the total number of indices $V_{cnt1}$ in the delay vote buffer such that:

$$delayVote[i] > V_{max} - \text{MAX\_MARGIN1}, L_{min} \leq i \leq L_{max}, \quad \text{Eq. (37)}$$

where MAX_MARGIN1 is a constant (e.g., one). Then we find the total number of indices $V_{cnt2}$ in the delay vote buffer such that:

$$delayVote[i] \geq V_{max} - \text{MAX\_MARGIN2}, L_{min} \leq i \leq L_{max}, \quad \text{Eq. (38)}$$

where MAX_MARGIN2 is a constant (e.g., two). In the case that $V_{cnt1} \geq$MAX_PEAK1 or $V_{cnt2} \geq$MAX_PEAK2, then the vote verification condition is not passed, where MAX_PEAK1 and MAX_PEAK2 are some constants (e.g., MAX_PEAK1=7, MAX_PEAK2=11). If $V_{cnt1}$ or $V_{cnt2}$ is too big, then the delay vote buffer is randomly distributed, and there is no concentration of the votes leading to delay convergence. If this happens, we reset the finite state machine (FSM) following the following resetting procedure:

P0) Finite state machine resetting procedure: 1) Reset the finite state machine state to the initial state $S_0$; 2) Reset the acoustic feedback event count afCount to zero; 3) Reset the delay convergence flag cvgFlag to FALSE; 4) Reset the state life time state duration to zero; 5) Reset the delay vote buffer delayVote[ ] to zero; 4) Reset other related buffers to zero.

The vote distribution in the auxiliary buffer delayVote $[L_{min}-i]$, $1 \leq i \leq$WIN_AUX is used for further vote verification, where WIN_AUX is a constant (e.g., 8, 9, or 10). Let $V_{cnt3}$ be the total number of indices in the delay vote buffer such that:

$$delayVote[L_{min}-i] > V_{max}, 1 \leq i \leq \text{WIN\_AUX}. \quad \text{Eq. (39)}$$

If $V_{cnt3}$>0 and $I_{max} \leq$DELAY_AUX, then the vote verification condition is not passed, where DELAY_AUX is a constant (e.g., 30). This is the case where the maximum $V_{max}$ is found at $I_{max} \in [L_{min}, \text{DELAY\_AUX}]$, but a greater vote value is found in the auxiliary buffer delayVote$[L_{min}-i]$, $1 \leq i \leq$WIN_AUX. Most likely, this is caused by some tone events, music events, or a noise signal. In this case, we reset the finite state machine (FSM) following the resetting procedure P0) as stated before.

Suppose the above vote verification condition passed. The total number of votes $V_{burst}$ in the range $[I_{max}-1, I_{max}+1]$ reflects burstiness of the acoustic feedback signal and is defined as follows:

$$V_{burst} = \sum_{i=I_{max}-1}^{I_{max}+1} delayVote[i]. \quad \text{Eq. (40)}$$

To qualify for acoustic feedback event, we define following conditions on $V_{max}$, $V_{mean}$, and $V_{burst}$:

C5) $V_{max}$ is bigger than a multiple of $V_{mean}$, i.e., $$V_{max} > V_{mean} * \text{MULT\_FACTOR}, \quad \text{Eq. (41)}$$

where MULT_FACTOR is a constant (e.g., a constant in the range [1.5, 5]).

C6) $V_{max}$ is bigger than $V_{mean}$ with enough margin, i.e., $$V_{max} > V_{mean} + AF\_MARGIN2, \quad \text{Eq. (42)}$$

where AF_MARGIN2 is a constant (e.g., 6, 7, or 8).

C7) The following combination of conditions on $V_{max}$, $V_{mean}$, and $V_{burst}$ are satisfied:

$$V_{max} > AF\_MARGIN2, \quad \text{Eq. (43)}$$

$$V_{burst} > V_{mean} + AF\_MARGIN0, \quad \text{Eq. (44)}$$

$$V_{max} > V_{burst}/2, \quad \text{Eq. (45)}$$

where AF_MARGIN0 is a constant (e.g., 12, 15, or 18).

Condition C5) states that $V_{mean}$ cannot be too big; otherwise, $V_{max}$ is not bigger than a multiple of $V_{mean}$. Condition C7) states that a vote spike happens over $[I_{max}-1, I_{max}+1]$ as in Eq. (44), but the vote at $I_{max}$ still has win margin as in Eq. (45).

The delay identification criterion for acoustic feedback is as follows: condition C5) and one of conditions C6) or C7) are satisfied.

If the delay identification criterion is satisfied and this is the first acoustic feedback event, then we set the acoustic feedback event count afCount=1. If this is not the 1$^{st}$ acoustic feedback event, then afCount>0. In this case, we need check what is the distance $|I_{max}-\text{afDelay}|$ between $I_{max}$ and fDelay. Let us introduce the following condition on the drift for each delay $I_{max}$ away from the measured delay afDelay.

C8) The event count afCount>0, and $$|I_{max} - afDelay| \le DELAY\_PREC, \quad \text{Eq. (46)}$$

where DELAY_PREC is a constant (e.g., DELAY_PREC=3 or 4).

If condition C8) is satisfied, then an acoustic feedback event is identified. We increase the event count and set the new delay measurement as follows:

$$afCount += 1, \quad \text{Eq. (47)}$$

$$afDelay = I_{max}. \quad \text{Eq. (48)}$$

If the event count is bigger or equal to a threshold CVG_THR, then the delay identification method converges, where CVG_THR is a constant (e.g., 3, 4, or 5). In this case, we set the convergence flag cvgFlag=TRUE.

We now consider the case where condition C8) is not satisfied. In the case that the new delay drifts too much from previous afDelay, i.e., $$|I_{max} - afDelay| > DELAY\_SPREAD, \quad \text{Eq. (49)}$$

where DELAY_SPREAD is a constant (e.g., 20, 25, or 30), then reset the event count afCount=0. If (49) is not satisfied, then we decrease the event count $$afCount -= 1. \quad \text{Eq. (50)}$$

If the event count afCount reaches zero after (50) from a positive value, then we perform the finite state machine resetting procedure P0) as stated before.

After the delay identification criterion is satisfied, we have described how to update the event count. In the following, we describe how to update the delay vote buffer, instead of resetting it to zero. The acoustic feedback sound is generated by a physical process; such physical process does not change its important parameters too quickly such as the delay. Once an acoustic feedback event happens, it tends to happen again next time. So we define a parameter as follows so that each term in the delay vote buffer can subtract it:

$$\text{Eq. (51)}$$

$$\psi_0 = \begin{cases} \max\left(V_{max} - AF\_MARGIN1, V_{max} - V_{mean} - \frac{AF\_MARGIN2}{2}\right), \\ \quad \text{if } V_{max} > V_{mean} + AF\_MARGIN2 \\ \max\left(\frac{V_{max}}{2}, V_{burst} - (V_{mean} + AF\_MARGIN0)\right), \text{ otherwise} \end{cases}$$

where AF_MARGIN1 is a constant (e.g., 5 or 6). Then we subtract $\psi_0$ from each term in the delay vote buffer:

$$delayVote[i] = \max(0, delayVote[i] - \psi_0), 0 \le i \le L_{max}. \quad \text{Eq. (52)}$$

The above update leaves a small number of votes at index $I_{max}$, which helps the convergence of the delay identification method. After the update, the vote number at delayVote $[I_{max}]$ is at the level of $$V_{mean} + \frac{AF\_MARGIN2}{2},$$

but less or equal to AF_MARGIN1. For example, if AF_MARGIN1=6 and AF_MARGIN2=7, then delayVote $[I_{max}]=\min(6, V_{mean}+3)$, if $V_{max}>V_{mean}+7$. In the other case that $V_{max} \le V_{mean}+7$, a similar small number is given to delayVote $[I_{max}]$ after the delay vote buffer updating Eq. (51)-Eq. (52).

Suppose that the convergence flag cvgFlag=TRUE, but the delay identification criterion is not satisfied. In this case, we verify the delay drift condition C8). If C8) is not satisfied, we perform the procedure (50). If the event count afCount reaches zero, then we perform the finite state machine resetting procedure P0). After that, we perform the delay vote buffer update procedure Eq. (51)-Eq. (52).

Suppose that the convergence flag cvgFlag=TRUE, but the delay $I_{max}$ is far from the previous delay measurement afDelay. If the following condition is satisfied:

$$|I_{max} - afDelay| > DELAY\_PREC + DELAY\_MARGIN0, \quad \text{Eq. (53)}$$

where DELAY_MARGIN0 is a constant (e.g., DELAY_MARGIN0=2), then we check whether the following multiplication relationship holds for $I_{max}$ and afDelay. Within a small constant difference such as DELAY_PREC+DELAY_MARGIN0, if $I_{max}$ is a multiple number of afDelay, or if afDelay is a multiple number of $I_{max}$, then we set a flag tempoFlag=TRUE; otherwise, this flag tempoFlag=FALSE.

In the case that tempoFlag=TRUE, and $I_{max}$ is a multiple number of afDelay, then we update the delay vote buffer as follows:

$$delayVote[i] = 0, \forall i \in \left[I_{max} - \frac{afDelay}{2}, I_{max} + \frac{afDelay}{2}\right]. \quad \text{Eq. (54)}$$

If tempoFlag=TRUE, then we pass the following operations. Otherwise, we perform the procedure (50). If the event count afCount reaches zero, then we perform the finite state machine resetting procedure P0). After that, we perform the delay vote buffer update procedure Eq. (51)-Eq. (52).

Finally, we consider the case that the delay verification criterion is not satisfied, and $V_{max}$ is too big. For example, if the following condition is satisfied:

$$V_{max} > VOTE\_MAX, \quad \text{Eq. (55)}$$

where VOTE_MAX is a big constant (e.g., 36, 45, or 60), then we perform the following operations:

$$\text{delayVote}[i] = \max(0, \text{delayVote}[i] - 1), 0 \leq i \leq L_{max}. \qquad \text{Eq. (56)}$$

This way, both $V_{max}$ and $V_{mean}$ are decreased by one. This helps to pass the delay verification criterion for the next frame.

VII. Example Finite State Machine for Smart Feedback Cancellation

Figure 11:
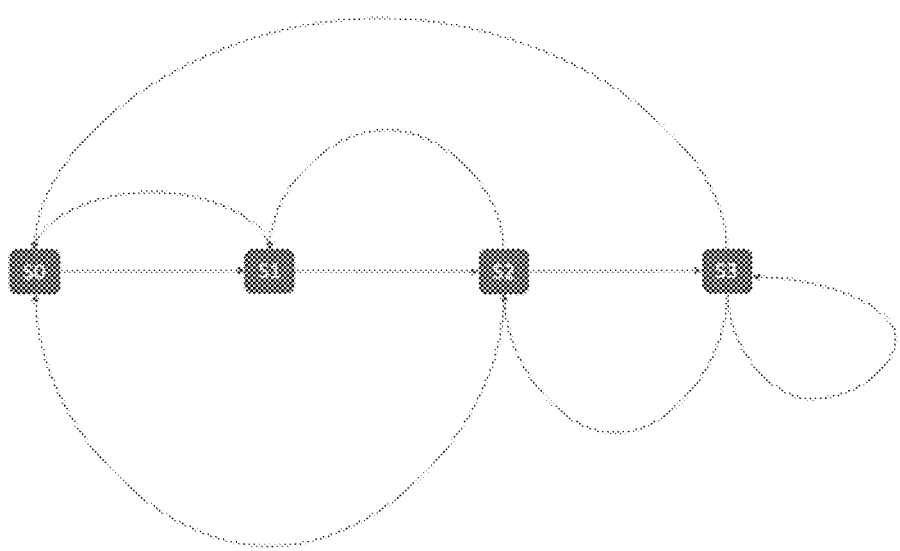
FIG. 11 illustrates a state diagram for acoustic feedback control in accordance with some implementations.

In one embodiment, the goal is to cancel the acoustic feedback signal once the delay identification method converges. A further improvement to increase the success rate of the acoustic feedback detection includes using a finite state machine (FSM). Referring to FIG. 11, a state machine is illustrated to aid in performing smart feedback cancellation. An example FSM implementation is now described, although it will be understood that many variations on the FSM implementation are possible.

The finite state machine starts from state $S_0$. A finite state machine generally consists of M states, where M is a positive integer. We use M=4 for illustration. Of course, if we increase the state number M, then the convergence time of the acoustic feedback detection becomes longer and the detection accuracy is increased. In the C language, the states for Smart Feedback Cancellation (SFC) are defined as follows:

typedef enum {
SFC_STATE0=0,
SFC_STATE1,
SFC_STATE2,
SFC_STATE3
} tSFC_STATE;

The FSM has a data structure tFSM_STATE, which has an instance of tSFC_STATE, called sfc_state. Each state has a life time called state_duration. At each state, the state life time state_duration increases by one for each frame.

At state $S_0$, if an acoustic feedback event is identified, then the event count is set to one as in Eq. (47)-Eq. (48). After resetting the state life time state_duration to zero, the finite state machine transits to the next state corresponding to afCount=1. Similarly, when a new acoustic feedback event is found at state $S_1$, the event count is increased to two. After resetting the state life time state_duration to zero, the finite state machine transits to state $S_2$. Since the state life time state_duration increases by one for every frame, state_duration may exceed a state life limit, e.g., $$\text{state\_duration} > af\text{Delay} + \text{VOTING\_INTERVAL}, \qquad \text{Eq. (57)}$$

where the VOTING_INTERVAL is a constant defined early for buffer switching. For states $S_1$ and $S_2$, if the state_duration exceeds the state life limit as in Eq. (57), i.e., (afDelay+VOTING_INTERVAL) frames, then we reset the finite state machine following the resetting procedure P0), where the finite state machine transits to the initial state $S_0$. Since the event count may decrease as in Eq. (50) due to delay drifting, the finite state machine may transit from $S_1$ to $S_{(i-1)}$, i=1, 2, 3.

At state $S_3$, the delay identification method converges, corresponding to the acoustic feedback sound being detected. This means that we set the convergence threshold CVG_THR=3. For state $S_3$, the execution part of the acoustic feedback cancellation process mutes the audio so that the annoying sound cannot be heard. So the state $S_3$ can be called a cancellation state of the finite state machine. When a small number of bursts of the acoustic feedback sound (e.g., one or two) are muted, there is no more feedback in the system. However, after the acoustic feedback is eliminated, normal communication needs to resume. So the finite state machine needs to transit to state $S_0$ from state $S_3$ as soon as possible after the acoustic feedback sound disappears.

To detect the disappearance of the acoustic feedback sound, one natural solution is to measure the consecutive silence frames. If the number of consecutive silence frames is big enough, then this means there is no acoustic feedback sound. For each frame, we check whether the total spectral energy defined by Eq. (6) satisfies the following condition:

$$EdB_{total}(m) \leq \Delta_S \qquad \text{Eq. 58}$$

where $\Delta_s$ is a constant (e.g., −44 dB, −47 dB, or −50 dB). If Eq. (58) is satisfied, then we increase the silence count silence_cnt by one:

$$\text{silence\_cnt} += 1 \qquad \text{Eq. 59}$$

otherwise, we reset silence_cnt=0. Essentially, silence_cnt is the frame number of consecutive silence period.

We further define an idle count idle_cnt to describe the scenario where Eq. (31)-Eq. (32) are not updated for all delayIdx$\in [L_{min}, L_{max}]$. To be more precise, if C0)-C2) or C2)-C4) is satisfied some delayIdx$\in [L_{min}, L_{max}]$, then we update Eq. (31)-Eq. (32) and reset idle_cnt=0; otherwise, we increase the idle_cnt by one:

$$\text{idle\_cnt} += 1. \qquad \text{Eq. (60)}$$

So idle_cnt is the consecutive frame number where there is no vote update in Eq. (31)-Eq. (32). We are now in a position to describe the conditions for the finite state machine to transit from state $S_3$ to state $S_0$.

C9) The silence count silence_cnt exceeds a threshold $$\text{silence\_cnt} \geq af\text{Delay} - \text{DIV\_MARGIN}, \qquad \text{Eq. (61)}$$

where DIV_MARGIN is a constant (e.g., 1, 2, or 3).
C10) The idle count idle_cnt exceeds a threshold $$\text{idle\_cnt} \geq af\text{Delay} + \min(af\text{Delay}, \text{SEARCH\_END}), \qquad \text{Eq. (62)}$$

where SEARCH_END is a constant (e.g., 50, 55, 60).
C11) The state life time state_duration exceeds a threshold $$\text{state\_duration} \geq af\text{Delay} + \text{SEARCH\_OVHD}, \qquad \text{Eq. (63)}$$

where SEARCH_OVHD is a constant (e.g., 80, 100, or 120).

If one of the conditions C9), C10), or C11) is satisfied, then the finite state machine resets itself following the resetting procedure P0). In this case, the finite state machine returns to the initial state $S_0$.

The state transit from $S_2$ to $S_3$ is critical since state $S_3$ is the cancellation state of the finite state machine. At state $S_2$, if an acoustic feedback event is found, then the event count increases to 3. Since we set CVG_THR=3, the delay identification method converges, and the convergence flag cvgFlag=TRUE. Before the finite state machine transits to state $S_3$, we perform the following acoustic feedback profile test. If this test is passed, then the verification flag verifFlag=TRUE and the finite state machine transits to state $S_3$. On the other hand, if this test is failed, then the verification flag verifFlag=FALSE and the finite state machine resets to the initial state, following the resetting procedure P0).

The 1st step is to check maximal spectral energy condition. Suppose that the current frame number is m* and $R_{max}$ is the maximal total signal spectral energy defined by (6) over all frames from 0 to m* as defined below:

$$R_{max} = \max_{0 \leq m \leq m^*} EdB_{total}(m), \qquad \text{Eq. 64}$$

Our observation is that when acoustic feedback happens, a howling sound tends to show up. In this case, R_max exceeds some energy threshold. If the following condition is satisfied:

$$R_{max} \leq \Delta_6, \qquad \text{Eq. (65)}$$

where $\Delta_6$ is a constant (e.g., −33 dB, −36 dB, or −39 dB), then the maximal spectral energy condition does not pass and the verification flag verifFlag=FALSE.

We now describe the delay swing condition. Each acoustic feedback event has a delay estimate as in Eq. (48). Let delay_min and delay_max be the minimum and the maximum among the delay measurements at state $S_1$, i=1,2,3. The delay swing condition requires that:

$$\text{delay\_max} - \text{delay\_min} \leq \text{DELAY\_PREC} + \text{DELAY\_MARGIN1}, \qquad \text{Eq. (66)}$$

where DELAY_PREC is a constant defined in Eq. (46), and DELAY_MARGIN1 is a constant (e.g., 0, 1, or 2). If the delay swing condition Eq. (66) is not satisfied, then the verification flag verifFlag=FALSE.

The next step is to verify the onset detection condition. Initially, we set the previous onset frame number pre_os=0. At state $S_0$, when an acoustic feedback event is identified, before the finite state machine transit to state $S_1$, we set the onset count os_count=0. If for frame m, condition C2) is satisfied, and the following two conditions are satisfied:

$$\Gamma(m) \geq \Delta_7, \qquad \text{Eq. (67)}$$

$$|m - \text{pre\_os}| > OS\_RANGE, \qquad \text{Eq. (68)}$$

where $\Gamma(m)$ is the onset novelty function defined by Eq. (9), $\Delta_7$ is a constant in the range [18 dB, 32 dB], OS_RANGE is a constant (e.g. 3, 4, or 5), then we perform the following operations:

$$os\_count += 1, \qquad \text{Eq. (69)}$$

$$os\_hangover = HANGOVER\_CNST, \qquad \text{Eq. (70)}$$

where we increase os_count by one in Eq. (69), and we set onset hangover variable os_hangover to a constant HANGOVER_CNST (e.g., 4, 5, or 6). Meanwhile, we set pre_os=m for the next onset detection. For the accuracy of the averaging operation Eq. (8), when an onset is detected, we stop the updating in (8) for HANGOVER_CNST frames. This can be done as follows: we decrease os_hangover by one whenever os_hangover>0 for each frame. We update (8) only if os_hangover=0.

The onset detection condition requires that $$os\_count \geq OS\_MIN, \qquad \text{Eq. (71)}$$

where OS_MIN is a constant (e.g., 1 or 2). If the on-set detection condition Eq. (71) is not satisfied, then the verification flag verifFlag=FALSE.

Related to the on-set detection condition is the onset frequency condition, which says that we cannot have too many onset detections from the state $S_1$ to the convergence of the delay identification method. At state $S_0$, before the finite state machine transit to state $S_1$, we save the current frame number to a variable af_initial. At frame m*, the on-set frequency condition requires the following is satisfied:

$$|m^* - af\_initial| \geq os\_count * MIN\_DIST, \qquad \text{Eq. (72)}$$

where MIN_DIST is a constant (e.g., 5, 6, or 7). If the above on-set frequency condition Eq. (72) is not satisfied, the verification flag verifFlag=FALSE.

We now describe the speech verification condition. In a telephony system, we want to cancel the annoying acoustic feedback sound but not unnecessarily mute speech. So it is important to identify the presence of speech, if any.

We define two arrays for speech and tone votes in the C language.

int spchVote[$L_{max}$+1],toneVote[$L_{max}$+1];

At state $S_0$, when an acoustic feedback event is identified, before the finite state machine transit to state $S_1$, we set the speech vote buffer spchVote[ ] and the tone vote buffer toneVote[ ] to zero. In the Smart Voice Enhancement (SVE) system, there is a voice activity detection (VAD) module. The output of VAD module VAD_ref[m] for frame m has two values: VAD_ref[m]=VAD_SPEECH means the current frame is a speech frame and VAD_ref[m]=VAD_NOISE means the current frame is a noise or silence frame, where VAD_SPEECH=0 and VAD_NOISE=1. To identify speech frames, we introduce the following conditions:

C12) For both m=p and m=q, $$VAD\_ref[m] = VAD\_SPEECH. \qquad \text{Eq. (73)}$$

C13) The total-to-low (TTL) ratio defined by (13) is bounded by a threshold $$EdB_{ratio}(m) \leq \Delta_8, \qquad \text{Eq. (74)}$$

for both m=p and m=q, where $\Delta_8$ is a constant (e.g., 2 dB, 3 dB, or 4 dB).

For the current frame p, if conditions C0), C2), and C12)-C13) are satisfied for some previous frames q, $0 \leq q \leq L_{max}$, then for the delay index delayIdx defined by Eq. (14) we increase one vote in the speech vote buffer:

$$spchVote[delayIdx] += 1. \qquad \text{Eq. (75)}$$

For the current frame p, if the previous conditions C2)-C4) are satisfied for some previous frame q, then one vote is added to the tone vote buffer corresponding to the delay index delayIdx defined by Eq. (14)

$$toneVote[delayIdx] += 1. \qquad \text{Eq. (76)}$$

Let us introduce the following speech verification condition.

C14) The speech vote buffer and the tone vote buffer satisfy the following conditions:

$$spchVote[afDelay] \geq \min\left(\frac{afDelay}{2}, SPCH\_ELEMENT\right), \qquad \text{Eq. (77)}$$

$$toneVote[afDelay] \leq TONE\_VERIF, \qquad \text{Eq. (78)}$$

where SPCH_ELEMENT and TONE_VERIF are some constants (e.g., SPCH_ELEMENT may be chosen from the range [10, 18] and TONE_VERIF may be chosen from the range [4, 6]).

If condition C14) is satisfied, then the verification flag verifFlag=FALSE; otherwise, the speech verification condition is passed.

Finally, let us introduce the acoustic feedback duration condition. As in the onset frequency condition Eq. (72), af_initial is the frame number when the finite state machine transits from state $S_0$ to state $S_1$. From state $S_1$ at af_initial to the current frame m*, the acoustic feedback duration condition requires:

$$|m^* - af\_initial| \geq afDelay + DETECT\_MARGIN, \qquad \text{Eq. (79)}$$

where DETECT_MARGIN is a constant (e.g., 1, 2, or 3). If condition (79) is satisfied, then the acoustic feedback duration condition passes; otherwise, this condition does not pass and we set cvgFlag=FALSE and set the event count $$afCount = CVG\_THR - 1, \qquad \text{Eq. (80)}$$

where the convergence threshold CVG_THR is previously defined. Equivalently, if the acoustic feedback duration condition does not pass, the finite state machine keeps at state $S_2$, and leaves the decision on delay convergence to the next acoustic feedback event if any.

When performing the above acoustic feedback profile test, if the verification flag verifFlag=FALSE, then the finite state machine resets to the initial state $S_0$, following the resetting procedure P0). On the other hand, if the verification flag verifFlag=TRUE, then the finite state machine transits to the cancellation state $S_3$ from state $S_2$.

The state $S_3$ is so-called cancellation state. At state $S_3$, for every frame m we perform the following operations:

$$X(m,k)=X(m,k)*\text{ATTN\_GAIN}, 0 \leq k \leq N-1, \quad \text{Eq. (81)}$$

where the attenuation gain ATTN_GAIN is a constant (e.g., −54 dB, −60 dB, or −66 dB). Applying such a small gain to the spectral signal is equivalent to mute the original time-domain signal after inverse FFT.

Additional Process Flow Charts

While various optimizations have been described above, it will be understood that many variations are possible in regards to automatically providing smart feedback control that would still provide a benefit to end users in comparison with users in a teleconference manually muting themselves after a howling effect becomes uncomfortable.

For example, a simpler algorithm may be employed that uses one or more of the features illustrated in FIG. 5. For example, a tone event acoustic feedback detector does not necessarily have to be included. Also, many variations on the algorithms used by the detectors 505 and 510 are possible. Other variations in the algorithms may be used for a delay identification test and making smart feedback cancellation decisions are possible. These variations, for example, encompass variations in how quickly and reliably the presence of acoustic feedback is detected, as well as the computational resources required.

Figure 12:
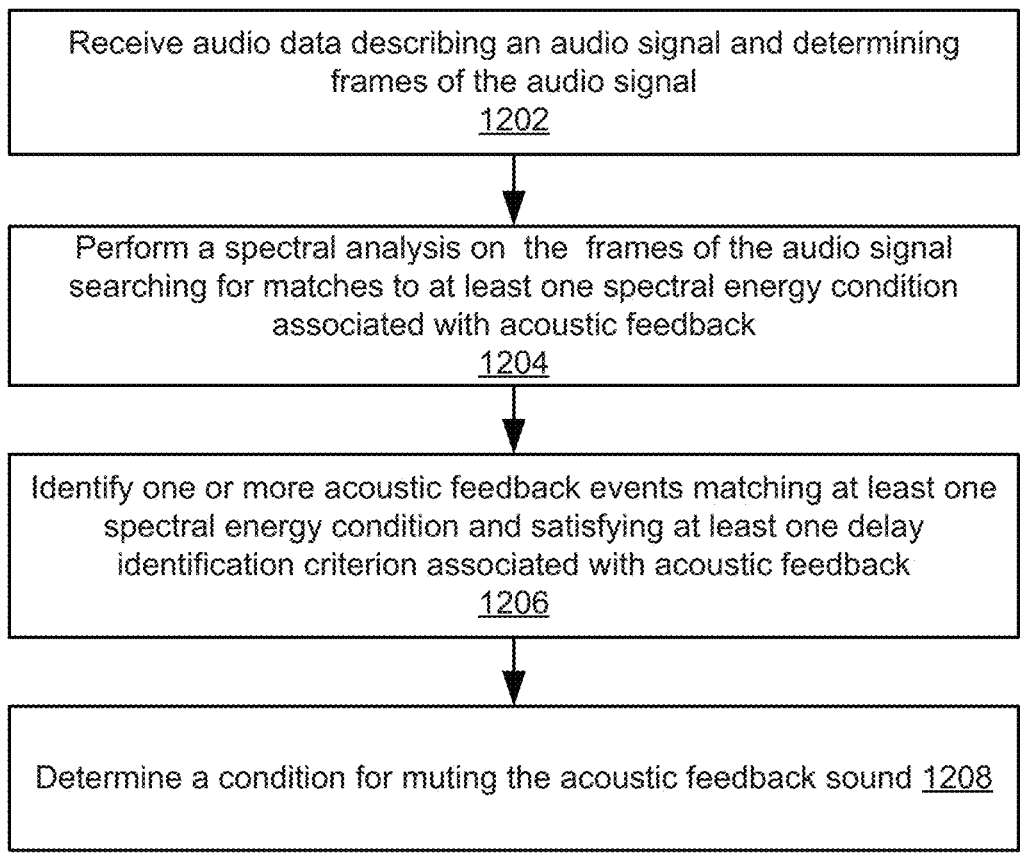
FIG. 12 is a flowchart of an example method of acoustic feedback control in accordance with some implementations.

FIG. 12 is a flowchart of a high level method of performing smart feedback cancellation in accordance with an embodiment. In block 1202, audio data describing an audio signal is received and frames of the audio signal are determined. This may include, for example, performing a FFT with a windowing function to generate a sequence of frames. In block 1204, a spectral analysis is performed of the frames. The spectral analysis includes looking for matches to at least one spectral energy condition associated with acoustic feedback. This may include, for example, looking for a match based on spectral energy attributes consistent with a howling effect. In block 1206, one or more acoustic feedback events are identified matching at least one spectral energy condition and satisfying at least one delay identification criterion associated with acoustic feedback. For example, spectrum match may be identified or a tone event identified. Additionally, a delay identification test may be satisfied. In block 1208, a condition for muting the acoustic feedback is determined. For example, the combination of factors may indicate the onset of acoustic feedback from which a decision can be made to mute the acoustic feedback for a selected number of frames or until silence is detected.

Figure 13:
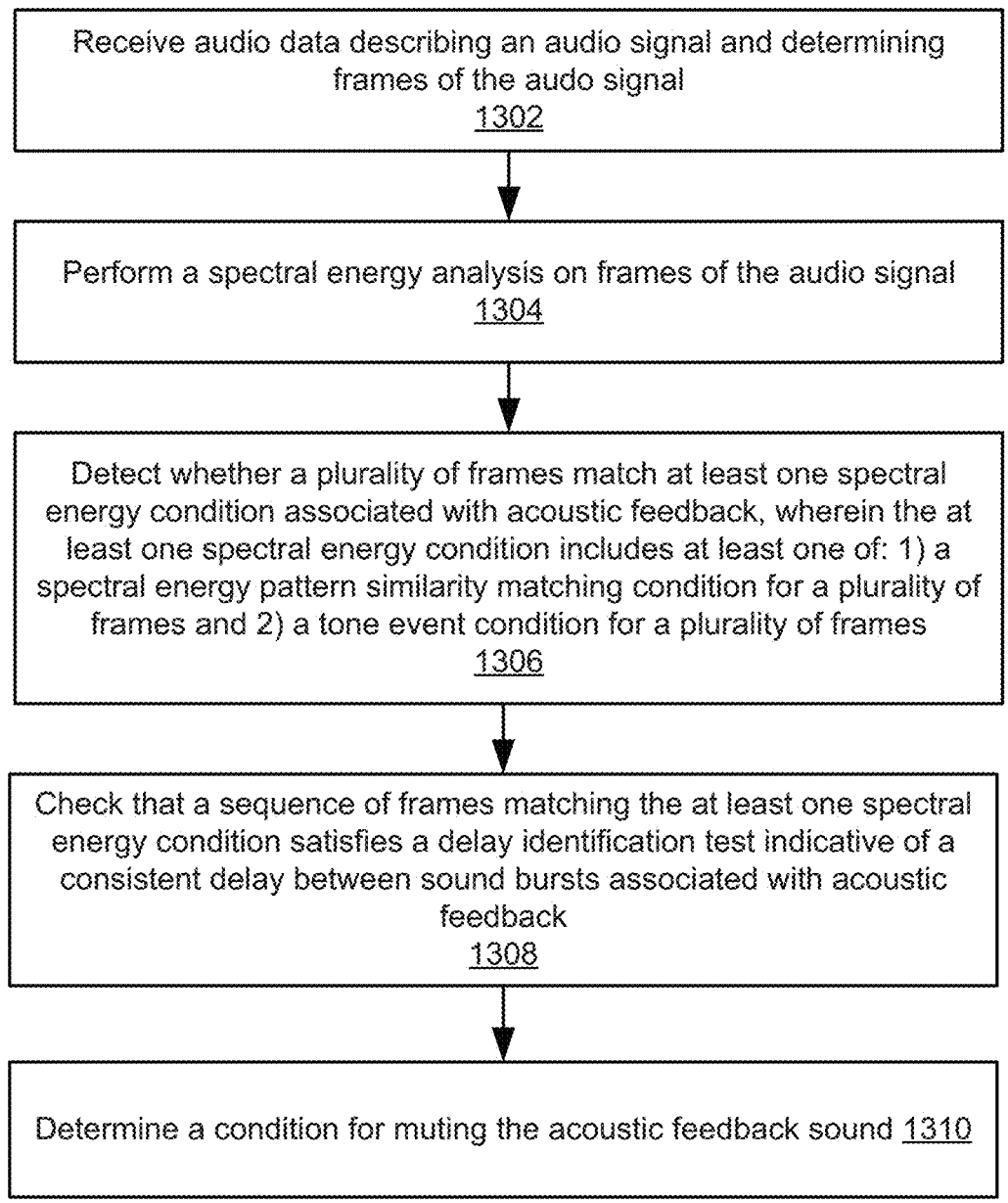
FIG. 13 is a flowchart of an example method of acoustic feedback control in accordance with some implementations.

FIG. 13 illustrates a somewhat narrower example of a method of smart feedback cancellation in accordance with an embodiment. In block 1302, audio data is received and frames are determined for the audio signal. This may include, for example, performing a FFT with a windowing function. In block 1304, a spectral energy analysis is performed on frames of the audio signal. In block 1306 at least one spectral energy condition is detected for a plurality of frames that are associated with acoustic feedback. The spectral energy condition includes at least one of a spectral energy pattern similarity matching condition and a tone event condition. In block 1308, an additional delay identification test is performed to check that a sequence of frames matching at least one spectral condition matches a delay identification test indicative of a consistent delay between sound bursts associated with acoustic feedback. In block 1310 a condition to determine when to mute the acoustic feedback sound is made.

Figure 14:
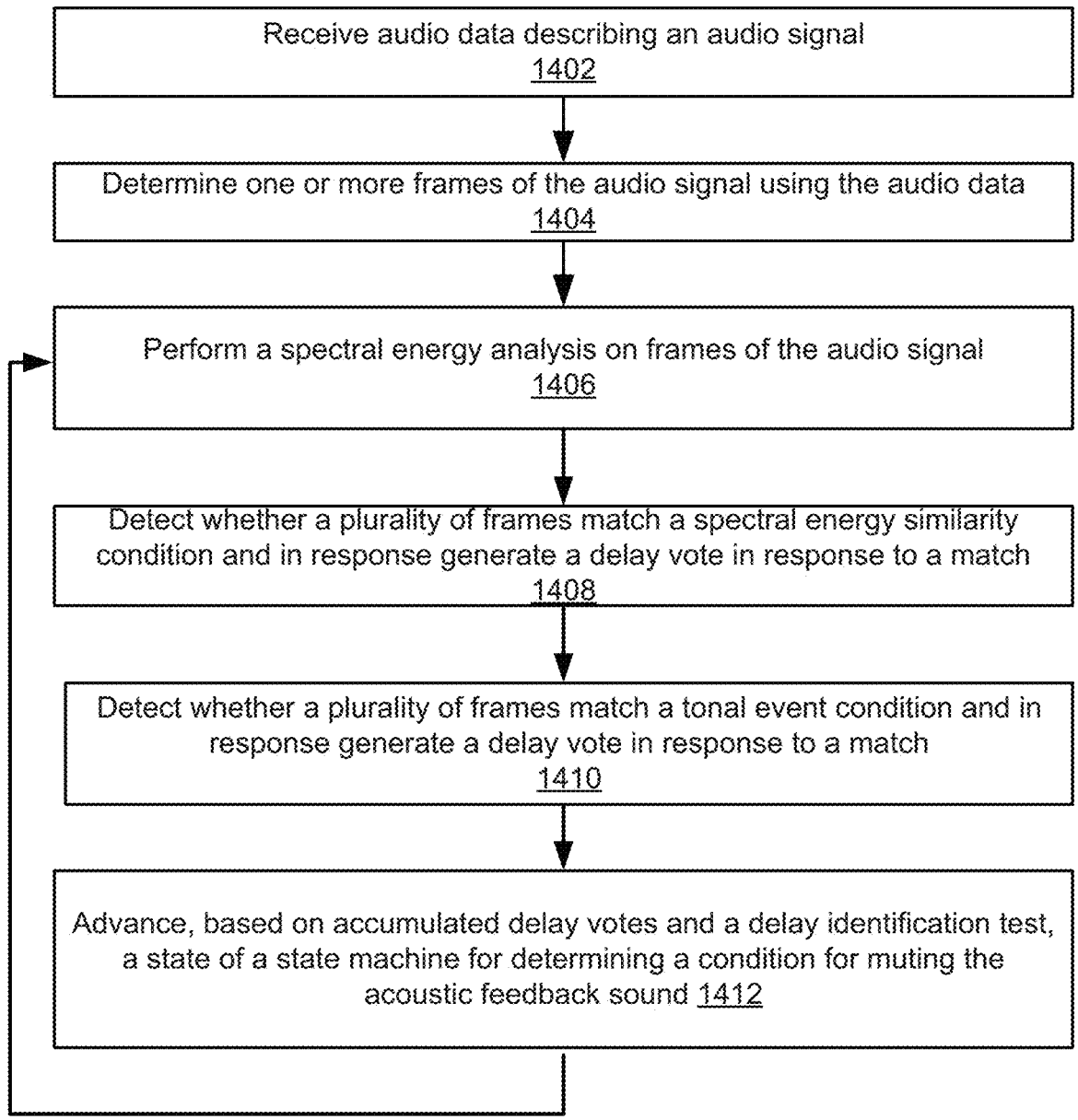
FIG. 14 is a flowchart of an example method of acoustic feedback control in accordance with some implementations.
Figure 15:
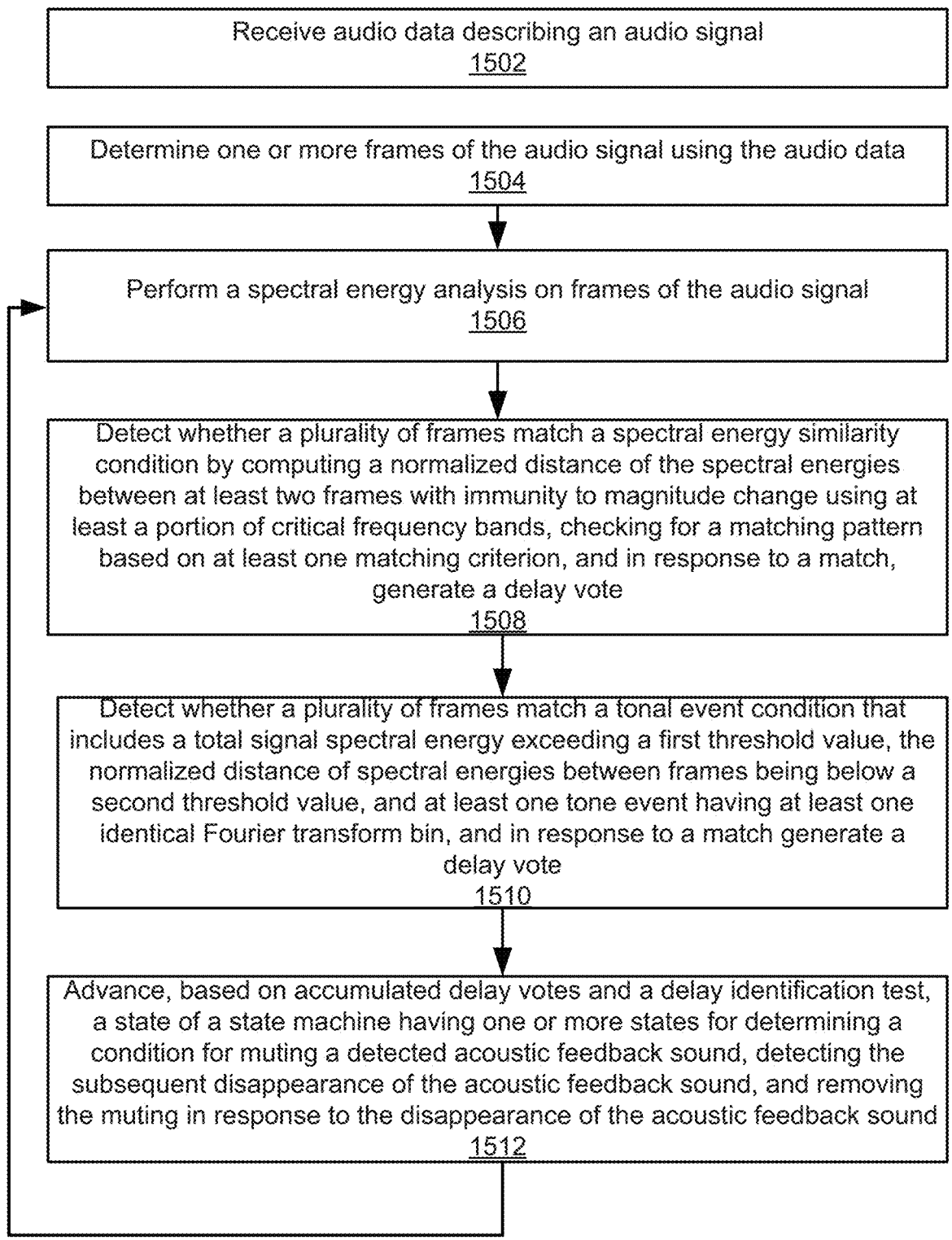
FIG. 15 is a flowchart of an example method of acoustic feedback control in accordance with some implementations.

As previously discussed, a state machine may be used in some embodiments. FIGS. 14 and 15 describe embodiments of methods using a state machine.

Referring to FIG. 14, in block 1402, audio data is received describing an audio signal. In block 1404, frames of the audio signal are determined. This may be performed, for example, using FFT with a windowing function. In block 1406, a spectral energy analysis is performed on frames of the audio signal. In block 1408, the process detects whether a plurality of frames match a spectral energy similarity condition and in response to a match a delay vote is generated. The spectral energy similarity condition may, for example, be based on the $L_1$ distances previously discussed. The number of frames necessary used to determine a match may be based on the considerations described above. The delay vote that is generated may, for example, be accumulated in one or more delay buffers. In block 1410, the process detects whether a plurality of frames match a tone event condition and in response to a match generate a delay vote. The delay vote may be accumulated in one or more delay buffers. The integration of two types of detection and delay buffer may be accomplished using the techniques described above. In block 1412, a state of a state machine is advanced based on accumulated delay votes in a delay identification test. As previously discussed, many variations on the number of states and the state machine implementation are possible to implement the goal of determining when to mute the acoustic feedback sound. The process may continue, as indicated by the feedback line.

FIG. 15 illustrates a flowchart of a slightly more detailed method for performing smart feedback cancellation using a state machine. In block 1502, audio data is received describing an audio signal. In block 1504 frames of the audio signal are determined. This may include FFT with a windowing function. In block 1506, a spectral energy analysis is performed on frames of the audio signal. In block 1508, the process detects whether a plurality of frames satisfies a spectral energy similarity condition. This may include computing a normalized distance between at least two frames with immunity to magnitude change using at least a portion of critical frequency bands. This may include checking for a matching pattern based on at least one criterion, and in response to a match generate a delay vote. In block 1510, the process detects whether a plurality of frames match a tone event condition. The tone event condition includes a total signal spectral energy exceeding a first threshold value, with the normalized distance of spectral energies between frames being below a second threshold value. At least one tone event having at least one identical Fourier transform bin. In response to a match, a delay vote is generated.

The delay votes are accumulated in one or more delay buffers. This may be performed in regards to techniques previously discussed. In block 1512, a state of a state machine may be advanced based on the accumulated delay votes and a delay identification test. The state machine determines a condition for muting an acoustic feedback sound, detecting the subsequent disappearance of the acoustic feedback sound, and removing the muting.

As will be understood by those familiar with the art, the invention may be embodied in other specific forms without departing from the spirit or essential characteristics thereof. Likewise, the particular naming and division of the portions, modules, agents, managers, components, functions, procedures, actions, layers, features, attributes, methodologies, data structures, and other aspects are not mandatory, and the mechanisms that implement the invention or its features may have different names, divisions and/or formats. The foregoing description, for purpose of explanation, has been described with reference to specific examples. However, the illustrative discussions above are not intended to be exhaustive or limiting to the precise forms disclosed. Many modifications and variations are possible in view of the above teachings. The examples were chosen and described in order to best explain relevant principles and their practical applications, to thereby enable others skilled in the art to best utilize various examples with or without various modifications as may be suited to the particular use contemplated.

What is claimed is:

1. A computer implemented method for acoustic feedback control, comprising:
   receiving, by a computing device, audio data describing an audio signal;
   determining, by the computing device, frames of the audio signal using the audio data;
   performing, by the computing device, a spectral energy analysis on frames of the audio signal;
   detecting, by the computing device, a plurality of frames matching at least one spectral energy condition associated with acoustic feedback;
   identifying, by the computing device, one or more acoustic feedback events in response to a plurality of frames matching the at least one spectral energy condition associated with acoustic feedback and satisfying, a delay identification test to identify a temporal delay between instances of detected matches converging to a consistent value associated with acoustic feedback, the delay identification test including generating a delay vote for each instance of detecting an instance of a match to the at least one spectral energy condition, accumulating delay votes in a delay vote buffer, and analyzing the accumulated delay votes to identify one or more acoustic feedback events that is a match to the at least one spectral energy condition; and
   determining, in real time, a condition for muting an acoustic feedback sound.

2. The computer implemented method of claim 1, wherein the detecting whether the plurality of frames matches at least one spectral energy condition associated with acoustic feedback comprises: performing at least one of: 1) matching a similarity of selected attributes of a spectral energy pattern for a plurality of frames indicative of a howling effect and 2) matching a tone event condition for a plurality of frames indicative of a howling effect.

3. The computer implemented method of claim 2, wherein matching a similarity of selected attributes of a spectral energy pattern for a plurality of frames indicative of a howling effect comprises: checking that: 1) a normalized distance of the signal spectral energy, immune to magnitude changes, is below a first threshold for at least two frames; and 2) a total-to-low ratio between the total signal spectral energy and low frequency components for the at least two frames is above a second threshold.

4. The computer implemented method of claim 2, wherein matching a tone event condition comprises a total signal energy exceeding a first threshold value, a normalized distance of spectral energies between frames being below a second value, and at least one identical Fourier transform bin.

5. The computer implemented method of claim 1, further comprising advancing a state of a state machine in response to accumulated delay votes and a delay identification test, with the state machine including at least one state for muting acoustic feedback after an onset of acoustic feedback and at least one additional state for removing the muting in response to an onset of silence.

6. The computer implemented method of claim 5 further comprising advancing a state machine in response to a delay vote and declaring that the audio signal includes acoustic feedback sound if the finite state machine transits to a final cancellation state.

7. A computer implemented method for acoustic feedback control, comprising:
   receiving, by a computing device, audio data describing an audio signal;
   determining, by the computing device, frames of the audio signal using the audio data;
   performing, by the computing device, a spectral energy analysis on frames of the audio signal;
   detecting, by the computing device, instances of a preselected number of frames matching at least one spectral energy condition associated with acoustic feedback wherein the detecting includes performing at least one of: 1) matching a similarity of selected attributes of a spectral energy pattern for a plurality of frames indicative of a howling effect and 2) matching a tone event condition for a plurality of frames indicative of a howling effect;
   performing, by the computing device, a delay identification test to identify a temporal delay between instances of the detected matches converging to a consistent value associated with acoustic feedback, wherein the delay identification test includes generating a delay vote for each instance of detecting an instance of a match to the at least one spectral energy condition, accumulating delay votes in a delay buffer, and analyzing the accumulated delay votes;
   identifying, by the computing device, one or more acoustic feedback events in response to a plurality of frames matching the at least one spectral energy condition and satisfying the identification test; and
   automatically performing acoustic feedback cancellation in response to identifying an acoustic feedback event.

8. A system for acoustic feedback cancellation in a communication system with at least one processor comprising:
   at least one processor; and
   a non-transitory computer memory storing instructions that, when executed by the at least one processor, cause the computer system to perform operations comprising:
      receiving audio data describing an audio signal;
      determining frames of the audio signal using the audio data;
      performing a spectral energy analysis on frames of the audio signal;
      detecting a plurality of frames matching at least one spectral energy condition associated with acoustic feedback;
      identifying one or more acoustic feedback events in response to a plurality of frames matching the at least one spectral energy condition associated with acoustic feedback and satisfying at least one delay identification test to identify a temporal delay between instances of the detected matches converging to a consistent value associated with acoustic feedback, wherein the delay identification test includes generating a delay vote for each instance of detecting an instance of a match to the at least one spectral energy condition, accumulating delay votes in a delay buffer, and the analyzing the accumulated delay votes; and determining, in real time, a condition for muting an acoustic feedback sound.

9. The system of claim 8, wherein the detecting whether the plurality of frames matches at least one spectral energy condition associated with acoustic feedback comprises: performing at least one of: 1) matching a similarity of selected attributes of a spectral energy pattern for a plurality of frames indicative of a howling effect and 2) matching a tone event condition for a plurality of frames indicative of a howling effect.

10. The system of claim 9, wherein matching a similarity of selected attributes of a spectral energy pattern for a plurality of frames indicative of a howling effect comprises: checking that: 1) a normalized distance of the signal spectral energy, immune to magnitude changes, is below a first threshold for at least two frames; and 2) a total-to-low ratio between the total signal spectral energy and low frequency components for the at least two frames is above a second threshold.

11. The system of claim 9, wherein matching a tone event condition comprises a total signal energy exceeding a first threshold value, a normalized distance of spectral energies between frames being below a second value, and at least one identical Fourier transform bin.

12. The system of claim 8, further comprising advancing a state of a state machine in response to accumulated delay votes, with the state machine including at least one state for muting acoustic feedback after an onset of acoustic feedback and at least one additional state for removing the muting in response to an onset of silence.

13. The system of claim 12 further comprising advancing a state machine in response to a delay vote and declaring that the audio signal includes acoustic feedback sound if the finite state machine transits to a final cancellation state.

14. A system for acoustic feedback cancellation in a communication system with at least one processor comprising:
at least one processor; and
a non-transitory computer memory storing instructions that, when executed by the at least one processor, cause the computer system to perform operations comprising:
receiving, by a computing device, audio data describing an audio signal;
determining, by the computing device, frames of the audio signal using the audio data;
performing, by the computing device, a spectral energy analysis on frames of the audio signal;
detecting, by the computing device, instances of a preselected number of frames matching at least one spectral energy condition associated with acoustic feedback;
performing, by the computing device, a delay identification test to identify a temporal delay between instances of the detected matches converging to a consistent value associated with acoustic feedback, wherein the delay identification test includes generating a delay vote for each instance of detecting an instance of a match to the at least one spectral energy condition, accumulating delay votes in a delay buffer, and the analyzing the accumulated delay votes;
identifying, by the computing device, one or more acoustic feedback events in response to a plurality of frames matching the at least one spectral energy condition and satisfying the identification test; and
automatically performing acoustic feedback cancellation in response to identifying an acoustic feedback event.

15. The system of claim 14, wherein the identifying is performed by advancing a state of a state machine having an initial state, at least one intermediate state, and a final cancellation state associated with performing acoustic cancellation.

16. The system of claim 14, wherein the detecting whether the plurality of frames matches at least one spectral energy condition associated with acoustic feedback comprises: performing at least one of: 1) matching a similarity of selected attributes of a spectral energy pattern for a plurality of frames indicative of a howling effect and 2) matching a tone event condition for a plurality of frames indicative of a howling effect.

17. A computer implemented method for acoustic feedback control, comprising:
receiving, by a computing device, audio data describing an audio signal;
determining, by the computing device, frames of the audio signal using the audio data;
performing, by the computing device, a spectral energy analysis on frames of the audio signal;
detecting, by the computing device, instances of a preselected number of frames matching at least one spectral energy condition associated with acoustic feedback;
performing, by the computing device, a delay identification test to identify a temporal delay between instances of the detected matches converging to a consistent value associated with acoustic feedback including generating a delay vote for each instance of detecting an instance of a match to the at least one spectral energy condition, delay votes are accumulated in a delay vote buffer, and the accumulated delay votes are analyzed to identify one or more acoustic feedback events;
performing, by the computing device, at least one test to distinguish acoustic feedback from at least one of noise, speech, and music;
determining one or more states of a finite state machine, having a plurality of states that includes an initial state and a cancellation state for acoustic feedback cancellation, based on the at least in part on the identified one or more acoustic feedback events.

18. The computer implemented method of claim 17, wherein the accumulated delay votes are used to identify acoustic feedback events and identify conditions for determining a state of the state machine.

19. The computer implemented method of claim 18, further comprising analyzing a delay vote distribution and resetting the finite state machine to the initial state in response to the delay vote distribution failing a delay verification condition indicative of the concentration of votes leading to delay convergence.

20. The computer implemented method of claim 18, further comprising determining if a delay vote distribution has a burstiness indicative of an acoustic feedback signal and resetting the finite state machine to the initial state in response to a failure of the second vote verification condition to have a vote distribution indicative of burstiness of an acoustic feedback signal.

21. The computer implemented method of claim 18, further comprising performing 1) a first check if the delay vote distribution is non-random and having characteristics associated with converging on a delay value associated with an acoustic feedback signal; and 2) a second check attributes indicative of a burstiness associated with an acoustic feedback signal;
  wherein the finite state machine is reset to the initial state in response to a failure of the first check or the second check.

22. The computer implemented method of claim 18, further comprising: resetting the finite state machine to the initial state if accumulated delay votes are within a pre-selected margin of votes and a number of indexes for which a delay vote buffer has a maximum reaches a threshold value; and 2) resetting the finite state machine to the initial state if at least one delay index in an auxiliary buffer is below a minimum delay value has more votes than the maximum, and the delay associated with a maximum is insufficiently far from the minimum.

23. The computer implemented method of claim 22, further comprising: verifying if the distance between the delay index with the maximum and the previously measured delay is bigger than a threshold value and in response decreasing an event count by one; and resetting the finite state machine to the initial state when the event count reaches zero.

24. The computer implemented method of claim 18, further comprising detecting voice activity in two or more frames, detecting at least one spectral energy similarity condition associated with the two or more frames being inconsistent with acoustic feedback, and in response resetting the finite state machine to the initial state.

25. The computer implemented method of claim 17, further comprising detecting a tone event, including identifying two frames having tone events with identical FFT bins with a maximal value and satisfying a condition on total minimum spectral energy for each frame and a normalized distance between each frame being below a threshold value.

26. The computer implemented method of claim 25, further comprising saving the FFT bin to a tone event buffer at a delay index if the signal spectral energy at the FFT bin has a maximal value and satisfies a maximal-to-background threshold margin test.

* * * * *